United States Patent [19]
Kang

[11] Patent Number: 6,142,723
[45] Date of Patent: Nov. 7, 2000

[54] TRANSFER APPARATUS

[75] Inventor: Ju Il Kang, Chungchcongnam-do, Rep. of Korea

[73] Assignee: Samsung Electronics Co., Ltd., Suwon, Rep. of Korea

[21] Appl. No.: 08/770,117

[22] Filed: Dec. 20, 1996

[30] Foreign Application Priority Data

Dec. 30, 1995 [KR] Rep. of Korea ...... 95-68175

[51] Int. Cl.[7] .................................................. B65G 49/07
[52] U.S. Cl. .................... 414/331; 414/417; 414/609; 414/937; 414/940
[58] Field of Search ................... 414/331, 217, 414/364, 567, 332, 417, 937, 940, 273, 609

[56] References Cited

U.S. PATENT DOCUMENTS

| 4,808,057 | 2/1989 | Chiappe et al. | 414/273 |
| 5,516,251 | 5/1996 | Ichikawa | 414/331 |
| 5,536,137 | 7/1996 | Jäger | 414/331 |
| 5,645,393 | 7/1997 | Ishij | 414/417 |
| 5,692,867 | 12/1997 | Kondo et al. | 414/331 |

*Primary Examiner*—Karen M. Young
*Assistant Examiner*—Raymond B. Johnson
*Attorney, Agent, or Firm*—Jones Volentine, L.L.P.

[57] ABSTRACT

A carrier transfer apparatus for automatically unloading and/or loading semiconductor device packages from and/or to printed circuit boards loaded into a carrier. The apparatus includes a housing, an input portion, an elevator portion and an output portion.

10 Claims, 28 Drawing Sheets

TRANSFER APPARATUS

BACKGROUND OF THE INVENTION

1. Field of the Invention

The present invention relates generally to a transfer apparatus for transferring a carrier loaded with a number of objects such as printed circuit boards. More particularly, the present invention relates to a carrier transfer apparatus for unloading and/or loading semiconductor device packages from and/or to printed circuit board loaded in the carrier.

2. Description of the Related Arts

The semiconductor chip package manufactured by a complex assembly process is subjected to various tests including thermal (e.g., bum-in and Temperature Cycling tests) and electrical tests to assure its reliability. Semi conductor packages are tested in mass using a printed circuit board carrying a plurality of packages.

The terms employed throughout this application 'unloader/loader', and 'carrier' will be described hereinafter.

The term 'unloader/loader' indicates a means for loading or unloading a semiconductor device package into or from a printed circuit board, and vice versa; and the term 'carrier' indicates a container which is capable of carrying a plurality of printed circuit boards.

Package reliability tests include, for example, the following steps (1) through (4):

(1) The packages are stored in a warehouse in a storage container unit such as a tube or tray. The containers carrying the packages, and printed circuit boards are manually transferred to an unloader/loader working area, where the packages are unloaded from the container and loaded to the printed circuit boards.

(2) The printed circuit boards loaded with a plurality of packages are manually mounted in a carrier placed on a cart, and then moved to a test equipment. The carrier carrying the printed circuit boards is manually loaded onto the test equipment and the packages in the printed circuit boards are subjected to thermal and/or electrical tests.

(3) After completion of the tests, the printed circuit boards are manually removed from the test equipment and loaded in the carrier on the cart. Then, the carrier is moved to the unloader/loader working area.

(4) At the unloader/loader working area, the printed circuit boards are removed from the carrier, and the packages are unloaded from the printed circuit board and mounted in the storage container. The storage container carrying the packages is moved to and stored at the warehouse. Good packages are stored, while the failed packages are destroyed.

In the conventional carrier transfer process described above, the steps of unloading and loading the packages and the printed circuit boards are carried out manually and have the following drawbacks: First, since the loading/unloading of the package into/from the printed circuit board is carried out manually at the printed circuit board level, the productivity varies depending on the skill; speed and efficiency of a particular worker; and second, since a cart is used to carry the printed circuit boards and is moved to different areas operation space is not efficiently utilized.

SUMMARY OF THE INVENTION

Thus, an object of the present invention is to provide a transfer apparatus to transfer a carrier loaded with printed circuit boards having a semiconductor device package mounted thereon, said apparatus achieving automated unloading/loading of the package from/into the printed circuit board.

The above and other objects of the present invention can be accomplished using the inventive carrier transfer apparatus including:

a hollow body part, of which front side is open;

an input part within the body part, which has (i) a body, (ii) guiding means provided on at least two neighboring edge sides of an upper surface of the body, (iii) a pair of opening means provided at two neighboring edge sides of the upper surface of the body and being operated by an electrical signal, one of the opening means being provided at the body's edge side facing the open front of the body part, (iv) a plurality of rolling members disposed at an area surrounded by the guiding means and the opening means, and (v) a transfer means fixed to an inner wall of the body part and being operated by an electrical signal;

An elevator part within the body part, which has (i) a pivoting shaft operated by a motor driven by an electrical signal and being fixed to bottom and top of the inner wall of the body part at its both ends; (ii) a supporting and transferring part disposed beside the input part, and comprising ① a pair of guiding rods, each being fixed to the bottom and top of the inner wall of the body part at their both ends, ② a body fixed to the guiding rods and associated with the pivoting shaft, ③ a pair of opposing guiding members, which are provided at two bottom corners of the body at a right angle, ④ a plurality of reinforcing members provided between and fixed to the pair of guiding members in parallel with the body, ⑤ a plurality of rolling members in a row provided on a facing surface of the guiding members, and ⑥ a transfer means fixed to the body; (iii) an opening means fixed to the guiding members at its both ends at a location facing the input part, the opening means being operated by an electrical signal; (iv) a plate formed with scaled horizontal gaps, the plate being vertically moved by an electrical signal; (v) a plurality of sensors fixed to the guiding rods, the sensors driving the motor by an on/off of the electrical signal by each gap of the plate; and (vi) a vertical displacement member located on the body part and being operated by an electrical signal from the sensors; and an output part within the body part, which has (i) a body, (ii) guiding means provided at two neighboring edge sides of an upper surface of the body, (iii) a pair of opening means provided at other two neighboring edge sides of the upper surface of the body and being operated by an electrical signal, one of the opening means being provided at the body's edge side facing the open front of the body part, (iv) a plurality of rolling members disposed at an area surrounded by the guiding means and the opening means, and (v) a transfer means fixed to an inner wall of the body part and being operated by an electrical signal.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 1:
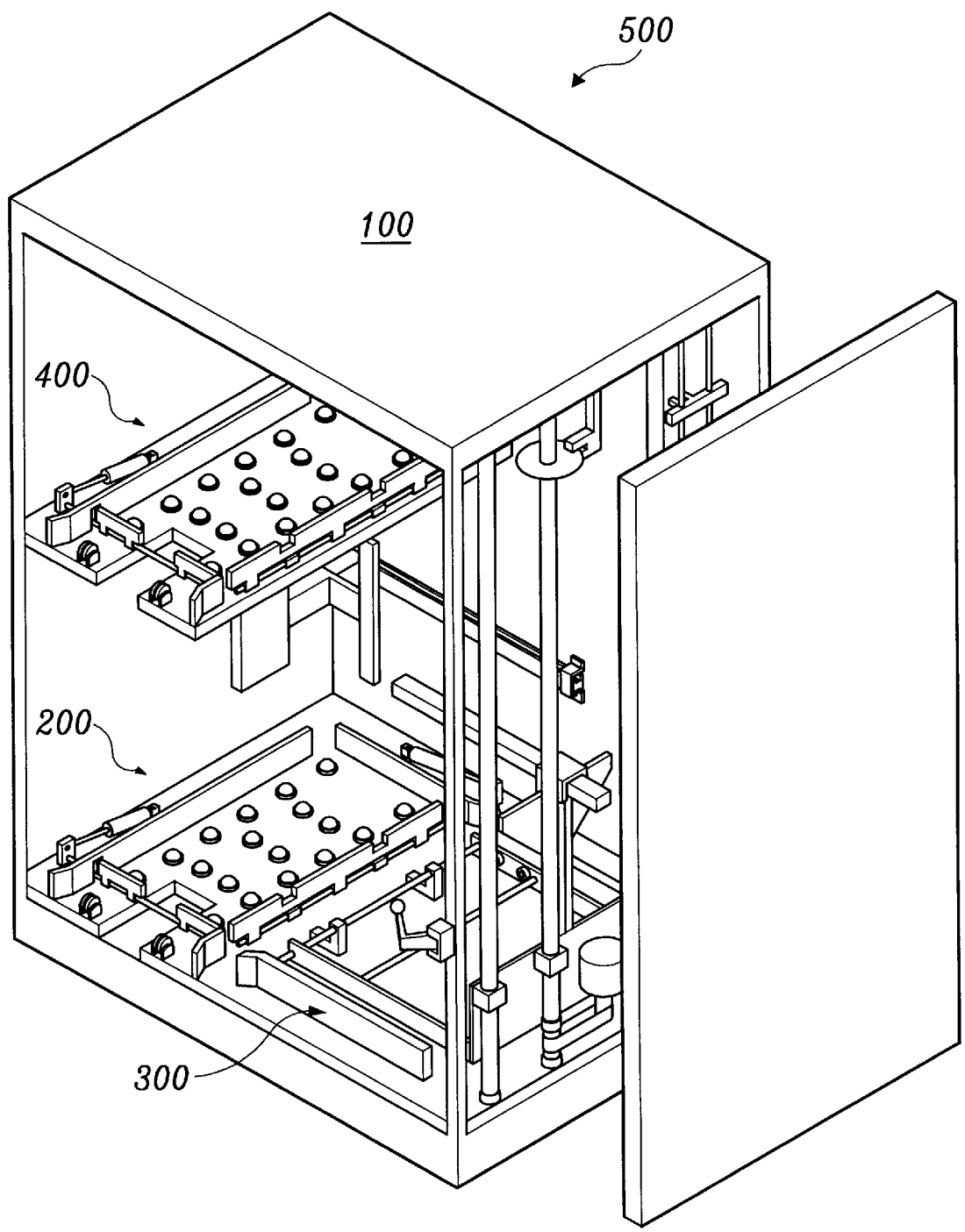
FIG. 1 is a schematic perspective view of a transfer apparatus of the present invention.

FIG. 1 is a schematic perspective view of the transfer apparatus of the present invention. With reference to FIG. 1, the carrier transfer apparatus (500) comprises a hollow body part (100) which is open at its front side and has an opening at its back side; an input part (200) on an inner bottom of the body part (100); an elevator part (300) disposed beside the input part (200) with a certain distance; and an output part (400) within the body part (100) and above the input part (200), said input part (200), elevator part (300) and output part (400) being provided within and fixed to the body part (100).

The detailed description of the structure of the input (200), elevator (300) and output parts (400) of the carrier transfer apparatus (500) will be given below.

Figure 2:
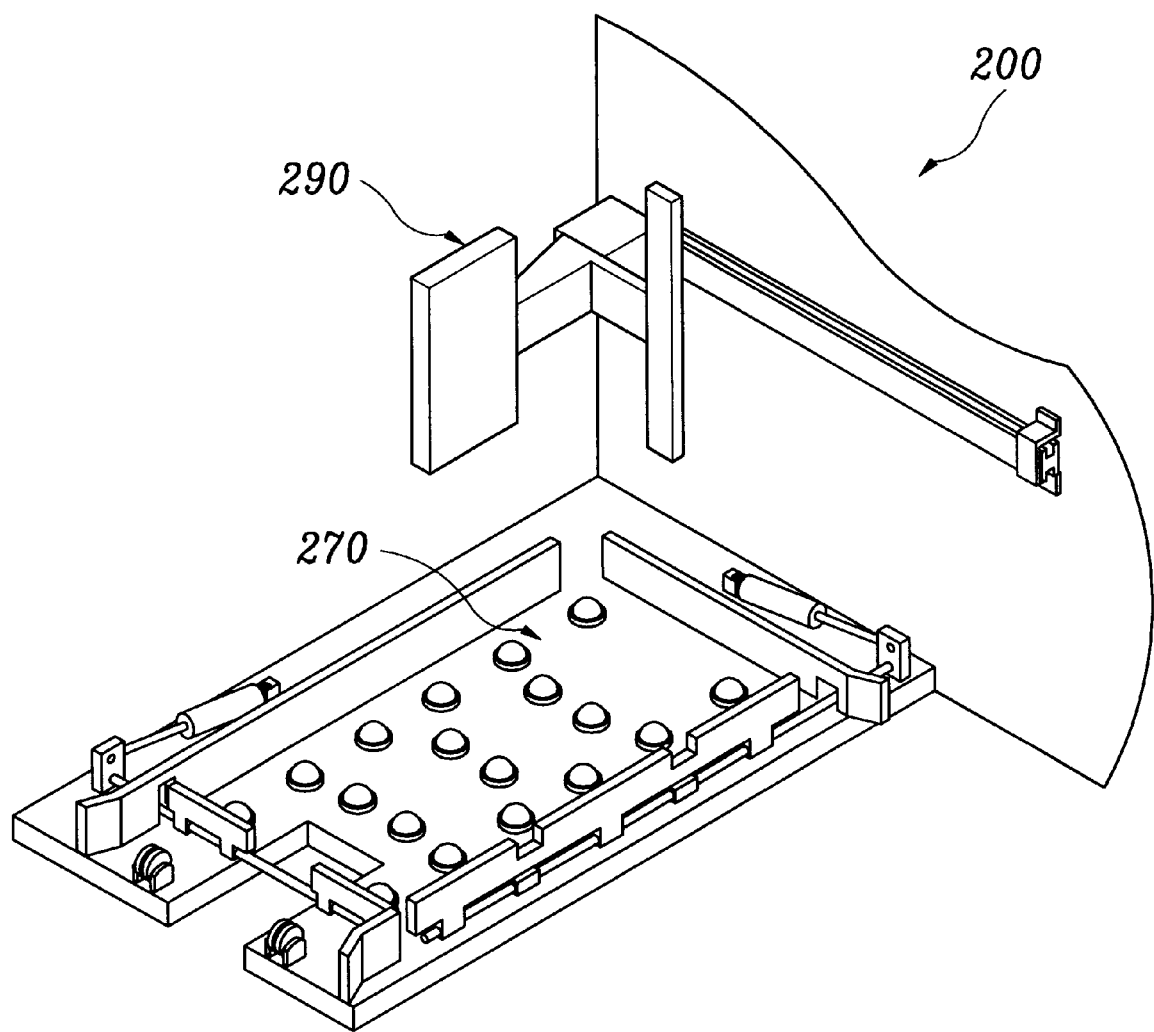
FIG. 2 is a perspective view depicting the input part in FIG. 1.
Figure 3:
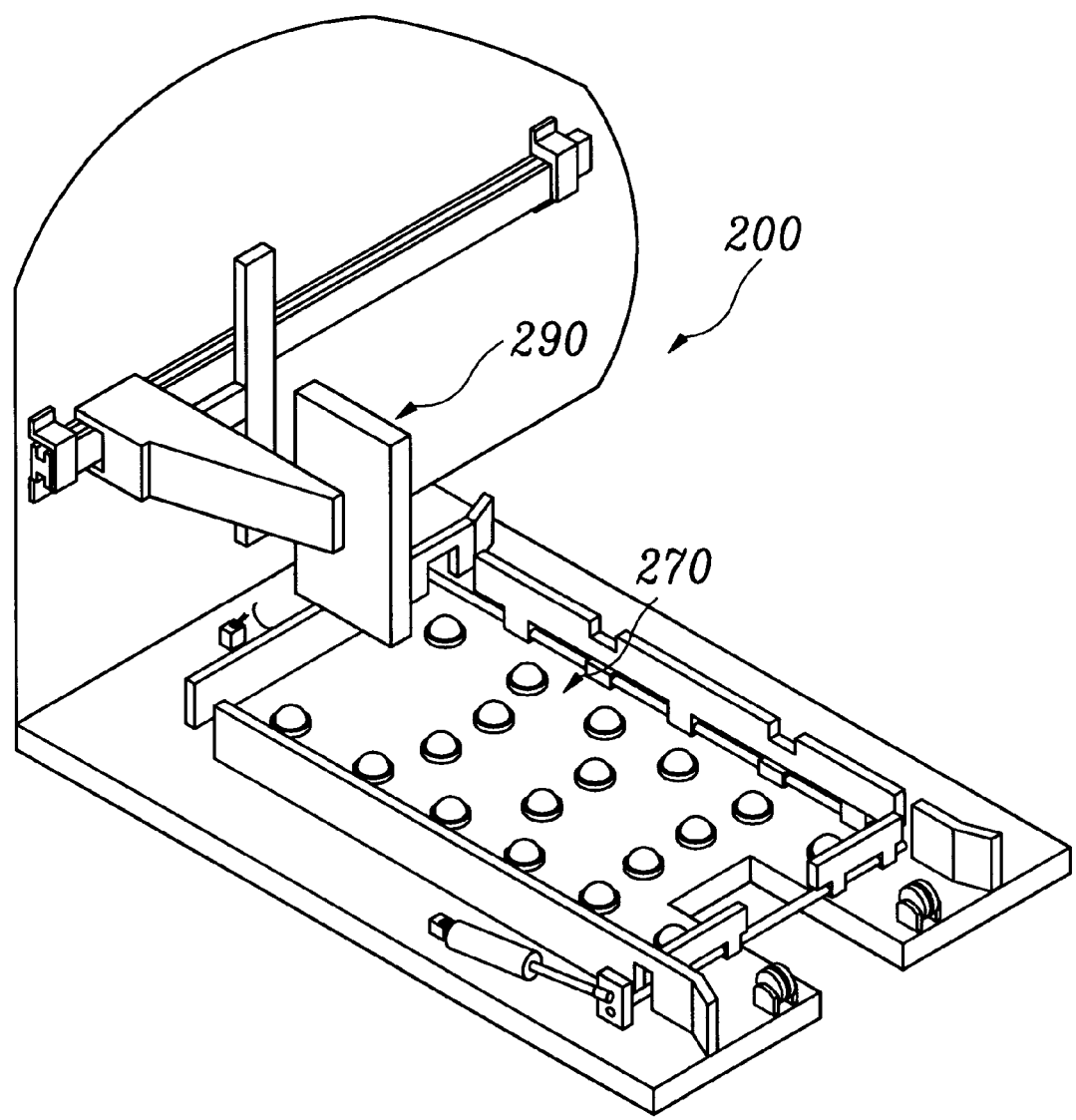
FIG. 3 is another perspective view depicting the input part in FIG. 2 taken from another position.

FIG. 2 is a perspective view depicting the input part in FIG. 1; and FIG. 3 is another perspective view depicting the input part in FIG. 2.

With reference to FIG. 2 and FIG. 3, the input part (200) comprises a supporting part (270) into which a carrier is loaded and a transfer part (290) for transferring the carrier to the elevator part (not shown). The detailed structure of the supporting part (270) will be explained in regard with FIG. 4 through FIG. 10, and the detailed structure of the transfer part (290) will be explained in regard with FIG. 11 and FIG. 12.

Figure 4:
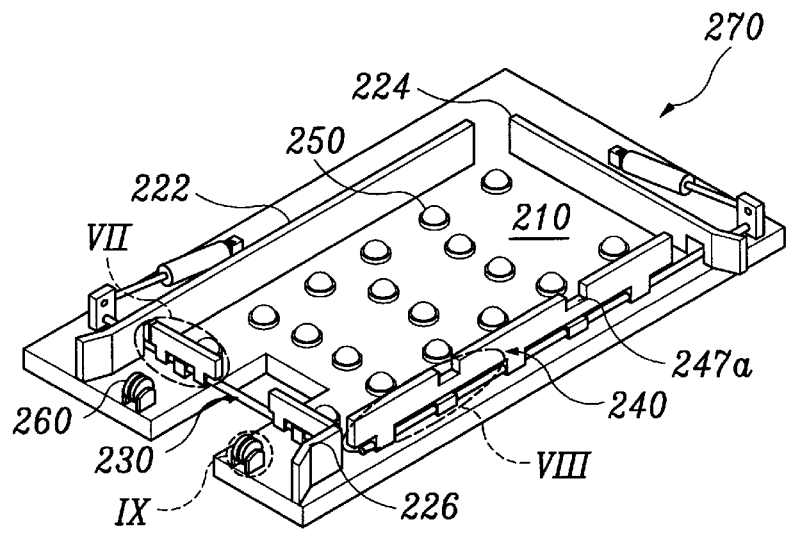
FIG. 4 is a perspective view of the supporting part in FIG. 2.
Figure 5:
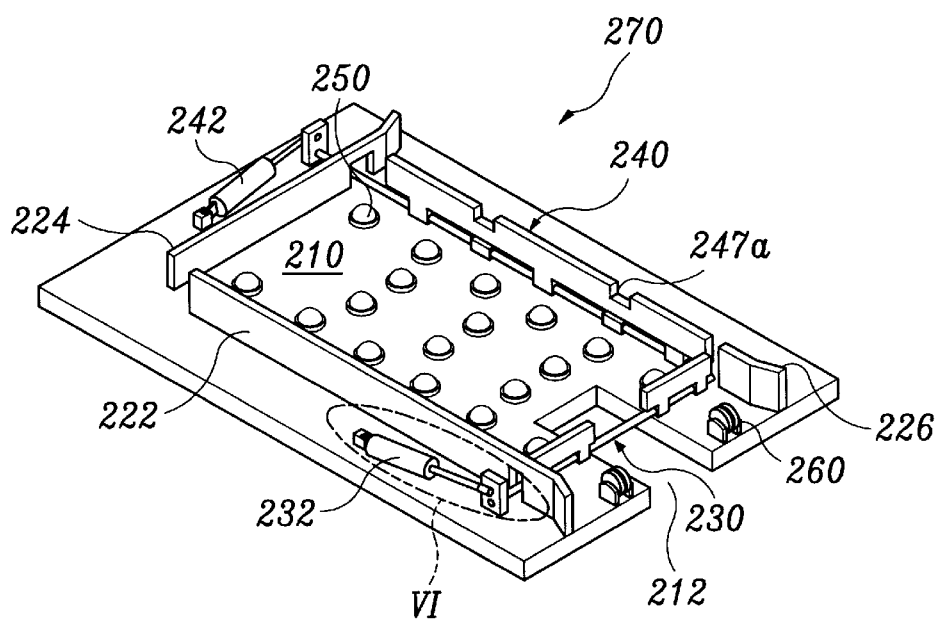
FIG. 5 is an another perspective view depicting the supporting part in FIG. 4 taken from another position.
Figure 6:
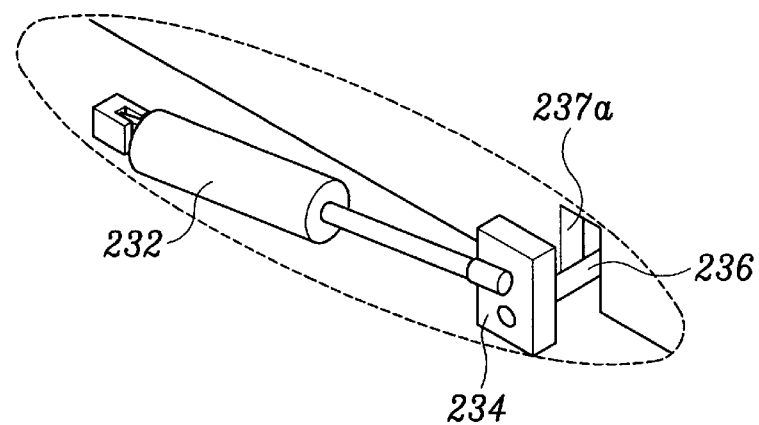
FIG. 6 is an enlarged perspective view of the part 'VI' in FIG. 5.
Figure 7:
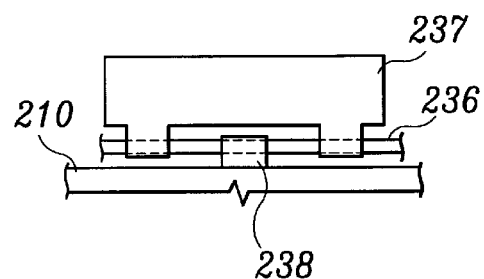
FIG. 7 is an enlarged front view of the part 'VII' in FIG. 4.
Figure 8:
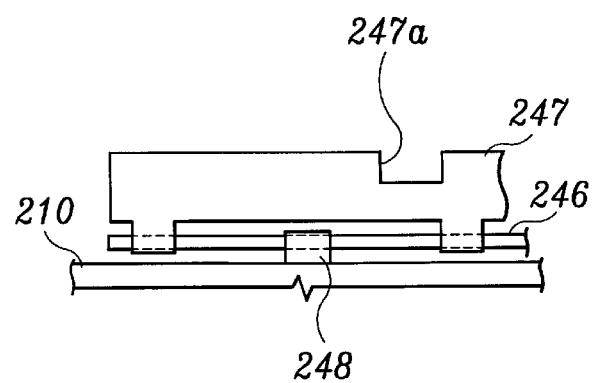
FIG. 8 is an enlarged front view of the part 'VIII' in FIG. 4.
Figure 9:
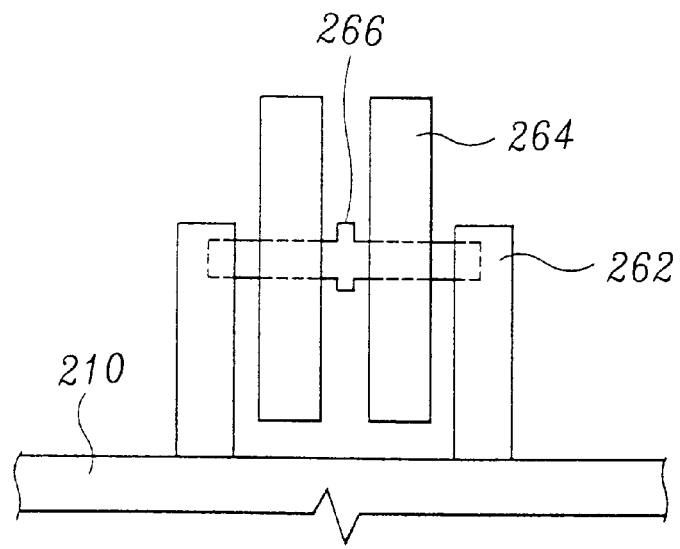
FIG. 9 is an enlarged front view of the part 'IX' in FIG. 4, which depicts its coupling system.
Figure 10:
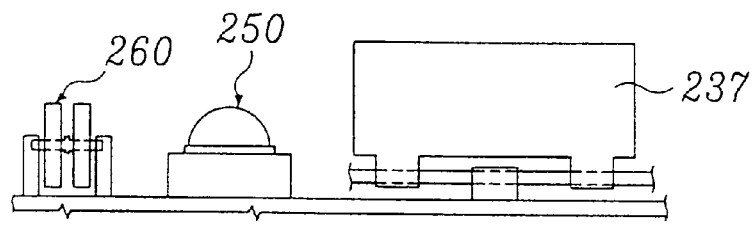
FIG. 10 is a front view depicting the relative heights of the ball bearings, of the rollers, and of the keepers in FIG. 4.

FIG. 4 is a perspective view of the supporting part in FIG. 2; FIG. 5 is an another perspective view depicting the supporting part in FIG. 4 taken from another position; FIG. 6 is an enlarged perspective view of the part 'VI' in FIG. 5; FIG. 7 is an enlarged front view of the part 'VIII' in FIG. 4; FIG. 8 is an enlarged front view of the part 'VIII ' in FIG. 4; FIG. 9 is an enlarged front view of the part 'IX' in FIG. 4, which depicts its coupling system; and FIG. 10 is a front view depicting the relative heights of the ball bearing and of the keeper of the opening means, and of the roller in FIG. 4.

With reference to FIG. 4 through FIG. 10, the supporting part (270) 10 comprises a body (210) having, for example a rectangular shape; three guiding members (222, 224, 226) each being formed along three peripheral edges on the upper surface thereof; two opening means (230, 240) one of which being provided at the remaining one peripheral edge and the other being provided at the neighboring one peripheral edge of upper surface thereof; and a plurality of rollers (260) and ball bearings (250) formed on the upper surface of the body (210) with a certain distance from the guiding members (222, 224, 226) and opening means (230, 240).

In more detail, the body (210) should have a strength sufficient to support the weights of the guiding members (222, 224, 226), of the opening means (230, 240), of the rollers (260) and ball bearings (250), and of a carrier loaded with a plurality of printed circuit boards to be tested. In FIG. 4 and FIG. 5, the body (210) is cut off at a central part of its one peripheral edge where only the opening means (230) is formed. However, the body (210) may not be cut off, since the cut-off area (212) has no specific function to constitute the supporting part (270).

The guiding members (222, 224, 226) will be described in more detail. There are formed three guiding members: the first guiding member (222) at one peripheral edge of upper surface of the body (210); the second guiding member (224) at one of the neighboring peripheral edges of upper surface of the body (210), and the third guiding member (226) at the next neighboring peripheral edge of upper surface of the body (210), so that the first guiding member (222) opposes the third guiding member (226). The first guiding member (222) has through hole (237a, FIG. 6), which will be described below. The precise location of the third guiding member (226) also will be described below. The opposing end portions of the first (222) and the third (226) guiding members are bent outward at an angle of 15–30 degrees as shown in FIG. 4 and FIG. 5.

The opening means (230, 240) will be described in more detail with reference to FIG. 6 through FIG. 9. On the upper surface of the body (210), there are formed the opening means: the first opening means (230) scanning the cut-off area and the second opening means (240) at the next neighboring edge.

The first opening means (230) comprises a cylinder (232) operated by an electrical signal for supplying or removing air pressure; a hinge (234) mechanically fixed to the cylinder (232) at its one surface; a rod (236) fixed to the other surface of the hinge (234), provided with a pair of keepers (237) at both opposing sides of cut-off area and passing by through hole (237a) of the first guiding member (222); and a pair of supporting members (238) into which the rod (236) is inserted. The rod (239) spans the cut-off area of the body (210).

The second opening means (240) has a same structure as that of the first opening means (230) except that the former has an integrated keeper (247) and the keeper (247) has grooves (247a) at certain positions. The detailed explanation of the grooves will be given below.

The air pressure cylinders (232, 242) of the first (230) and second (240) opening means are located outward and in parallel with the first (222) and second (224) guiding members on the body (210).

The guiding members (222, 224, 226) and the opening means (230, 240) have a role of guiding precisely the carrier loaded with a plurality of printed circuit boards to be tested into the input part (200). In particular, the first (222) and third (226) guiding members can compensate for displacement of the carrier fed into the input part (200). The opening means (230, 240) also are involved in the feeding and transferring of the carrier in addition to its original function of guiding the carrier.

Now, the rollers (260) will be explained with reference to FIG. 9. The rollers (260) are provided in front of the first guiding member (230) on the upper surface of the body (210). They comprise a pair of opposing supports (262) having a hole at the center of its facing surface; a pair of wheels (264) provided with through holes; and a pin (266) inserted through the holes of the wheels (264) and fitted into the holes of the supports (262) at its both ends, and having a diameter greater than that of the hole of the wheels (266) at its middle point. This structure of the rollers (260) allows an only one directional movement so that displacement of the carrier in the other directions is prevented, Ball bearings. (250) allow movements in all directions.

With reference to FIG. 10, the rollers (260) and ball bearings (250) have the same heights, while the keepers (237, 247) of the opening means (230, 240) have a height greater than the rollers (260) or the ball bearings (250). Thus, once the carrier is fed into the input part (200), the carrier does not move even if an external impact is applied. And, when the keepers (237, 247) are prostrated by the action of the air pressure cylinders (232, 242), its height is smaller than those of the rollers (260) and of the ball bearings (250) so that the feeding or transferring of the carrier is not disturbed.

Moreover, the guiding members (222, 224, 226) have a height greater than those of the rollers (260) and ball bearings (250). If not, the carrier fed into the input part (200) will be displaced so that its precise feeding or transfer is not attained.

Figure 11:
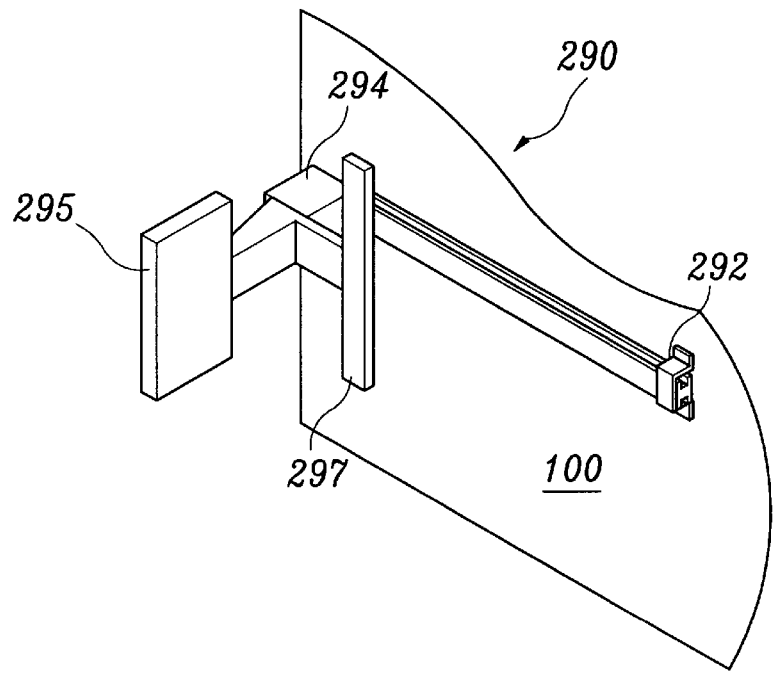
FIG. 11 is a perspective view of the transfer part in FIG. 2.
Figure 12:
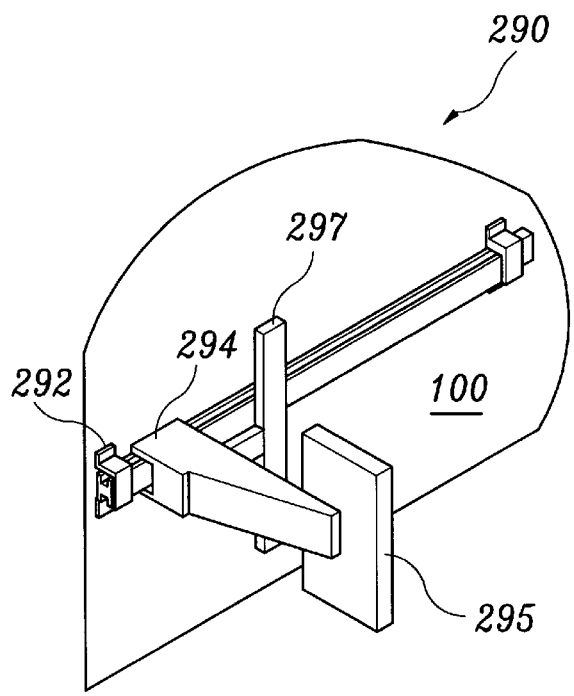
FIG. 12 is a perspective view of the transfer part in FIG. 3.

FIG. 11 is a perspective view of the transfer part in FIG. 2; and FIG. 12 is a perspective view of the transfer part in FIG. 3. With reference to FIG. 11 and FIG. 12, the transfer part (290) has a role of pushing one side of the carrier to move it to an elevator part (not shown), which will be explained below. The transfer part (290) comprises a pair of support plates (292), fixed to the wall of the body part (100) in FIG. 1); and a sliding cylinder (294) having a pushing plate (295) and stopper (297), said cylinder (294) being slidably fixed at both its ends to the support plates (292).

The sliding cylinder (294) has a length such that the first position of the pushing plate (295) can depart from a facing side of the carrier fed within the supporting part (270) and that the final position of the pushing plate (295) can push the facing side of the carrier to feed the carrier into the elevator part described below. The length may be, for example, smaller than the distance from the first position to the final position of the pushing plate (295).

Figure 13:
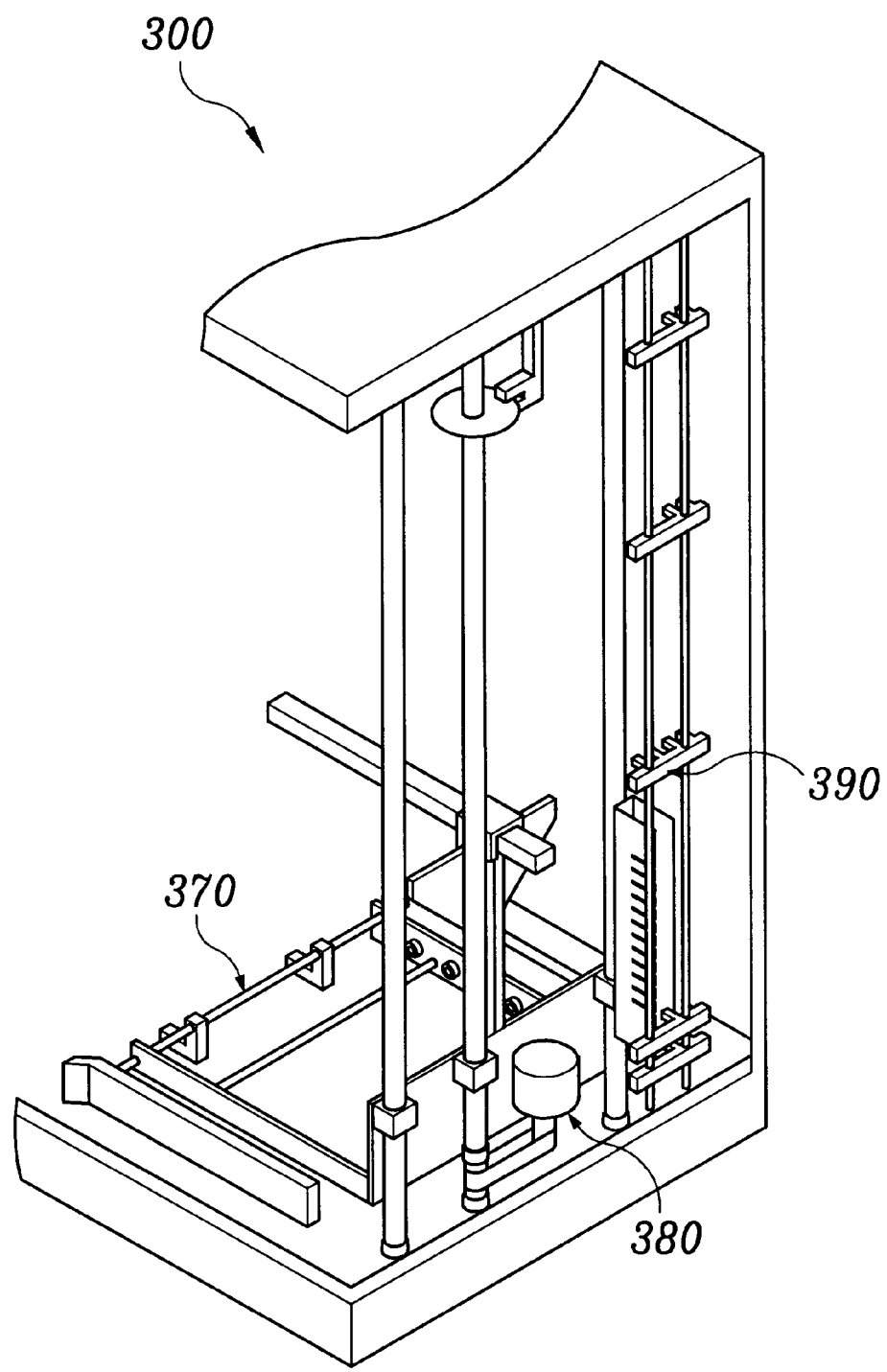
FIG. 13 is a perspective view of the elevator part in FIG. 1.
Figure 14:
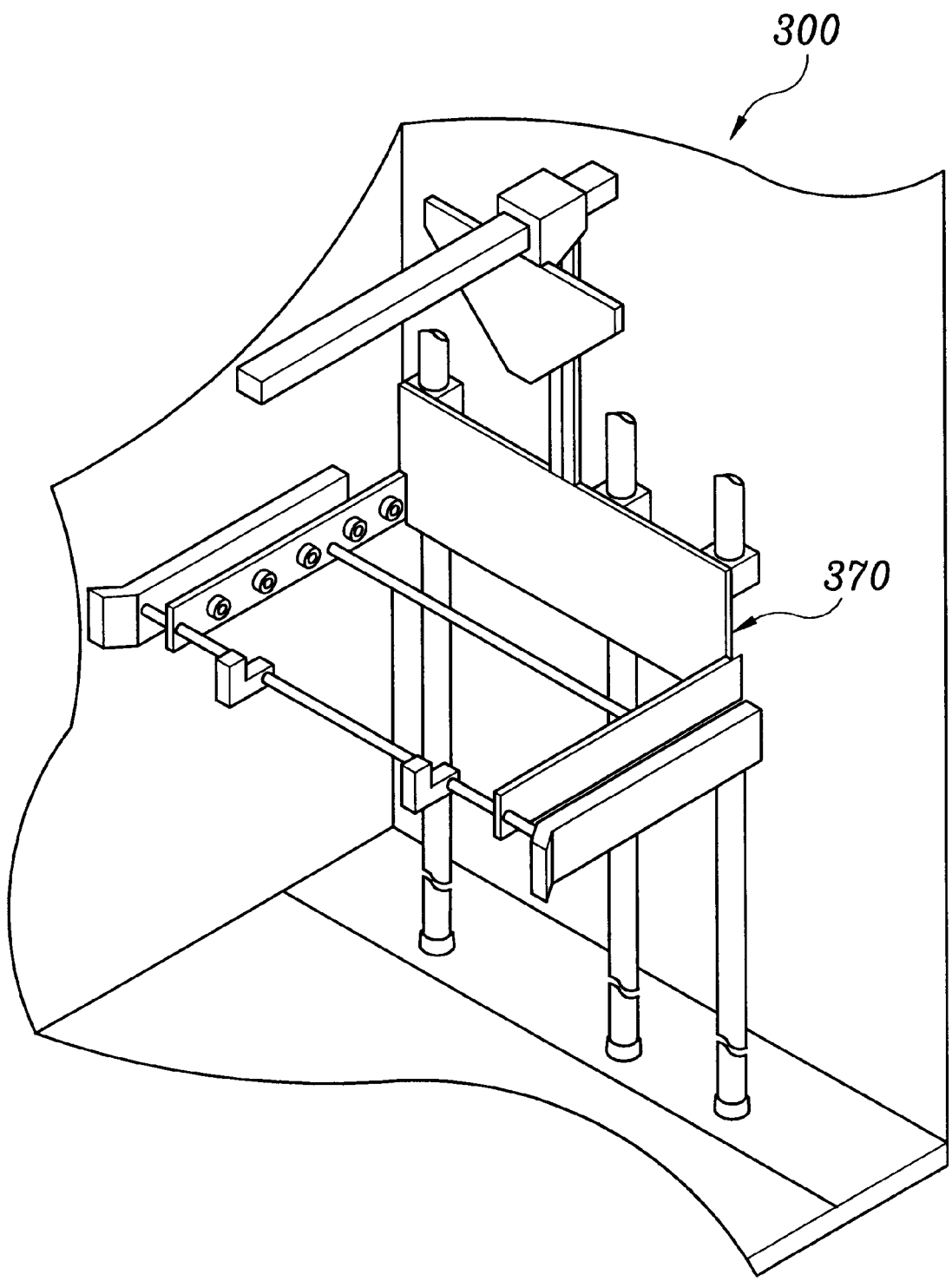
FIG. 14 is an another perspective view of the elevator part in FIG. 1 taken from another position.

FIG. 13 is a perspective view of the elevator part in FIG. 1; and FIG. 14 is the another perspective view of the elevator taken from other position. With reference to FIG. 13 and FIG. 14, the elevator part (300) comprises a supporting and transferring part (370) for fixing, supporting and carrying the carrier moved from the input part (200) as well as for transferring the carrier to the output part (not shown) by a vertical movement; a driving part (380) for moving vertically the supporting and transferring part (370); and a sensor part (390) for electrically controlling the driving part (380) so that the individual printed circuit board can be transferred from the carrier, which was fed to the supporting and transferring part (370), to the unloader/loader. The detailed explanations of the driving part (380), of the supporting and transferring part (370) and of the sensor part (390) will be given below with reference to FIG. 15, FIG. 16 through FIG. 18, and FIG. 19, respectively.

Figure 15:
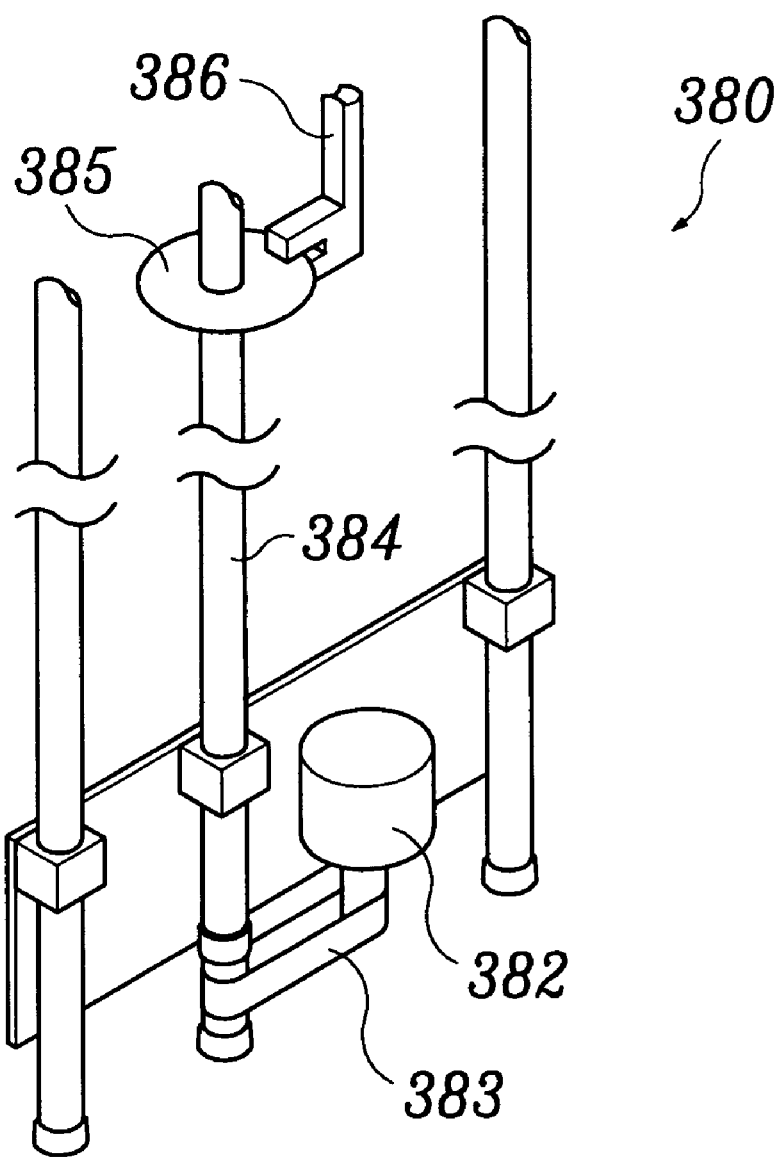
FIG. 15 is a perspective view depicting the driving part in FIG. 13.

FIG. 15 is a perspective view depicting the driving part in FIG. 13. With reference to FIG. 15, the driving part (380) comprises a motor (382) located beside the body part (100) described above; a screw shaft (384) which is operated by an action of the motor (382), is fitted into the bearings (not shown) on lower and upper surfaces of the body part (100), and is provided with a disc (385) at its top part; and a sensor (386) for detecting the disc (385) so that detecting the displacement of the screw shaft (384).

The motor (382) associated with the screw shaft (384) such that the motor (382) located beside the body part (100) by the action of an electrical signal triggers the movement of the belt (383), which consequently rotates the shaft (384).

The sensor (386) has two fingers and is 'F'-shaped. The sensor (386) is associated with the screw shaft (384) such that disc (385) can be inserted between two fingers of the sensor (386). When displacement of the disc (385) occurs, the lower or upper surface of the disc will mechanical contact with the sensor (386) which initiates a transfer of an electrical signal to the motor (382) to stop the operation of the motor (382). The screw shaft (384) is fitted into bearings (not shown) on the body part (100) and rotationally moved by the action of the motor (382).

Figure 16:
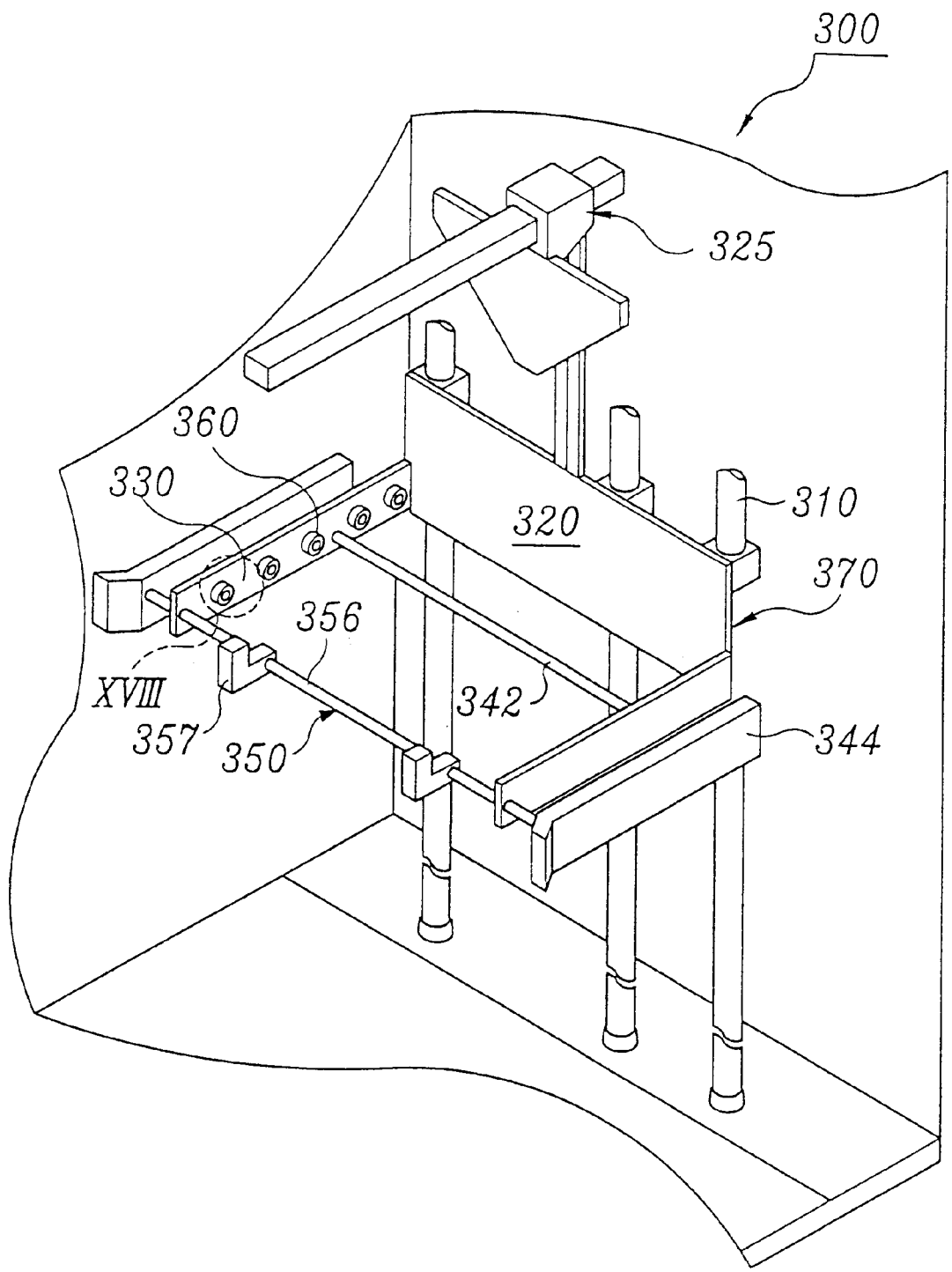
FIG. 16 is a perspective view depicting the supporting and transferring part in FIG. 14.
Figure 17:
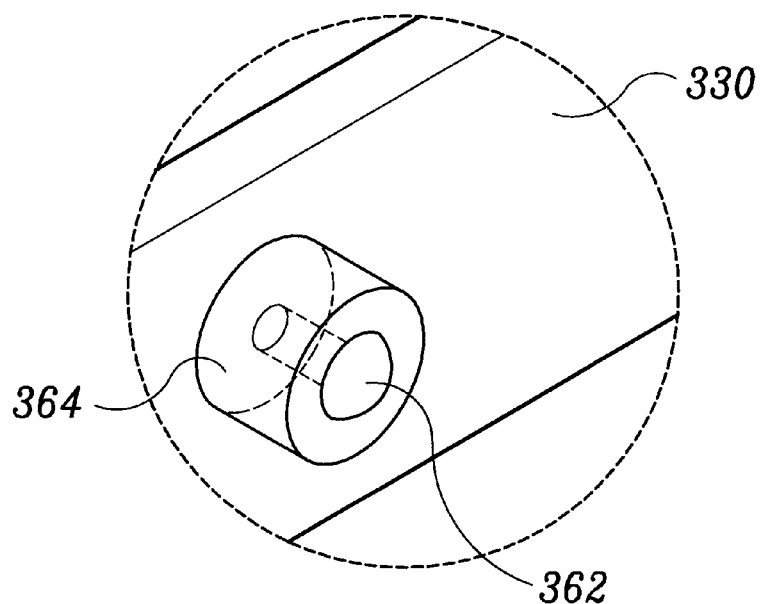
FIG. 17 is an enlarged perspective view of the part 'XVII' in FIG. 16.

The FIG. 16 is a perspective view of the supporting and transferring part in FIG. 14; FIG. 17 is an enlarged view of the part 'VII' in FIG. 16; and FIG. 18 is a front view depicting the relationship between the heights of the opening means and of the rollers.

Figure 18:
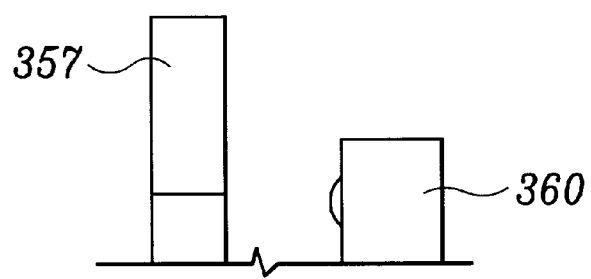
FIG. 18 is a front view depicting the relative heights of the opening means and of the roller in FIG. 14.

With reference to FIG. 16 through FIG. 18, the supporting and transferring part (370) having ① a pair of guiding rods (310), each being fixed to top and bottom of inner wall of the body part at their both ends, ② a body (320) to which the pair of guiding rods (310) are fixed and which is associated with the shaft (not shown), ③ a pair of opposing guiding members (330) provided at two bottom corners of the body at a right angle to the body (320), ④ a plurality of reinforcing members (342, 344) provided between and fixed to the pair of guiding members (330), said reinforcing members being parallel to the body (320), ⑤ a sub transfer means (325) provided at an upper edge surface of the body (320); and ⑥ a row of a plurality of rolling members, for example rollers (360) provided on opposing facing surfaces of the guiding members (330). There is provided an opening means (350) which goes through the holes of the guiding members (330) and fixed to a second reinforcing member (320) described below.

The reinforcing members (342, 344) reinforce the guiding members (330) provided at two opposing lower corners of the body (320), and comprises a plurality of first reinforcing members (342) fixed to inner surfaces of the guiding members (330) at both ends and the second reinforcing members (344) mechanically connected to the guiding members (330). The first reinforcing members (342) are fixed to the guiding members (330) at points below the row of the rollers (360), and the second reinforcing members (344) have grooves into which the rods (356) of the opening means (350) described below are fitted.

Of course, the reinforcing members (342, 344) can be modified in the shape or number, as long as they can have a strength sufficient to bear up the total weight of the carrier carrying a plurality of printed circuit boards on the rollers (360) of the guiding members (330), said carrier being moved from the input part (200).

The rollers (360) will be described with reference to FIG. 17. The rollers (360) have a structure that a roller wheel (364) having a through hole at its center is fitted to a projection (362) on the guiding members (330), and the end of the roller wheel is riveted to prevent a release thereof from the projection (362). The roller (360) rotates around the projection (362) in the same direction as that of moving of the carrier from the input part (200).

The opening means (350) has the same structure as that of the opening means (230) in FIG. 8, except that the former has a plurality of hook-shaped keepers (357). The through holes of the guiding members (330) and of the reinforcing members (342) act as a support like the supporting means (248) of the opening means (230) in FIG. 8.

With reference to FIG. 18, the height of the keeper (357) of the opening means (350), when the keeper (357) is in locking state, is higher than that of the rollers (360). Therefore, once the carrier is fed into the input part (200), the carrier is not displaced even if an external impact is applied. And, when the keepers (357) are prostrated by the action of the air pressure cylinders (352), its height is smaller than those of the rollers (360) so that the feeding or transferring of the carrier is not disturbed.

Figure 19:
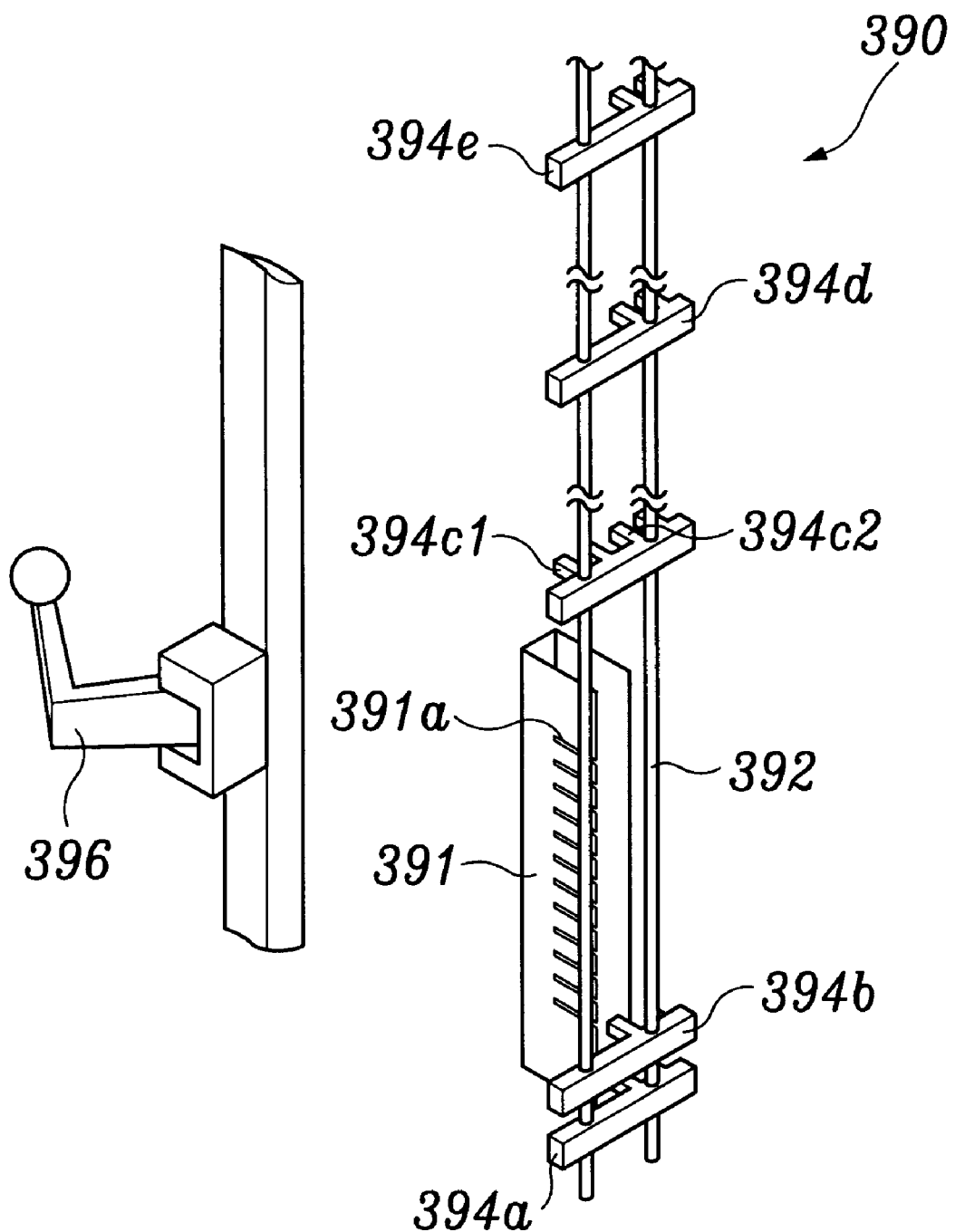
FIG. 19 is an enlarged perspective view of the sensor part in FIG. 13.

FIG. 19 is an enlarged view depicting the sensor part (390) in FIG. 13. With reference to FIG. 19, the sensor part (390) comprises a plate (391) formed with a plurality of horizontally distanced parallel gaps (391a), said plate being vertically moved by an action of an electrical signal; a pair of guiding rods (393) fixed between the bottom and the top of the body part (100); a plurality of sensors (394a–e) are fitted to the guiding rods (393), said sensors driving the motor by an on/off of the electrical signal by the gaps (391a) of the plate (391); and a push-up member located on the body part (100) and being operated by an electrical signal of the sensors (394a–e) to feed a desired printed circuit board to the unloader/loader from the carrier.

The plate (391) is '⊏'-shaped and is formed with the plurality of horizontal gaps (391a) at a certain interval on its one arm. The plate (391) may be installed, for example, behind the body (320).

The sensors (394a–e) have an 'F'-shape and emit infrared ray from the end of one finger thereof and receive the ray at the end of the other finger. The state when the finger receives the ray is defined as 'ON', while the state when the finger does not receive the ray is defined as 'OFF'. In FIG. 19, a plurality, for example five sensors are provided at different positions, each of which has different roles. The sequential ON/OFFs of the parallel sensors (394) are accomplished by the vertical movement of the plate (391), each arm of which moves between two fingers of the sensors (394a–e). The first (394a), second (394b), fourth (394d) and fifth (395e) sensors have a pair of fingers, while the third (391c) sensor has two pairs of fingers. The two guiding rods (393) pass between each pair of fingers of the sensors (394c1–394c2).

The length of the plate (391), the positions and functions of each sensors (394a–e) fitted and fixed to the guiding rods (393), and operational mechanism of feeding of the printed circuit board to the unloader/loader by the push-up means (396) will be described in more detail hereinafter with reference to FIG. 36.

Figure 20:
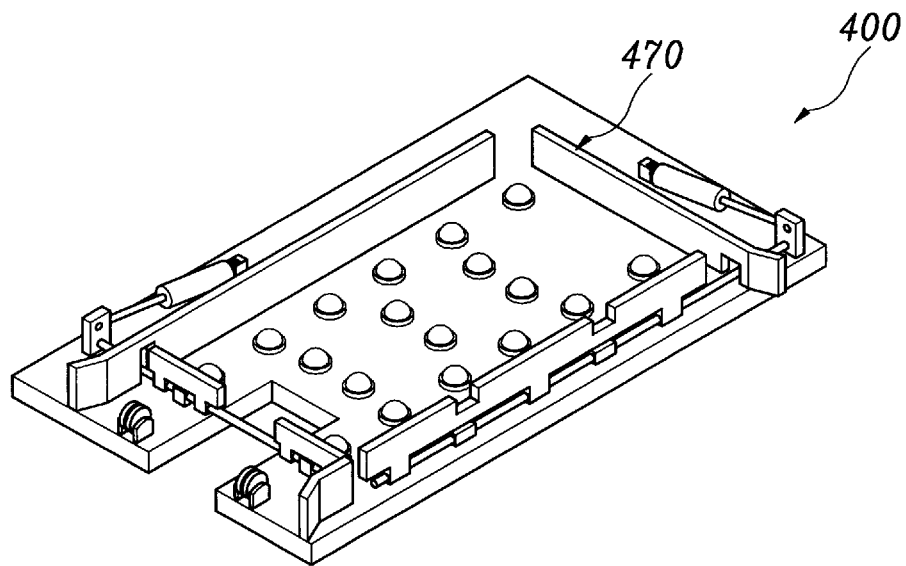
FIG. 20 is a perspective view of the output part in FIG. 2.
Figure 21:
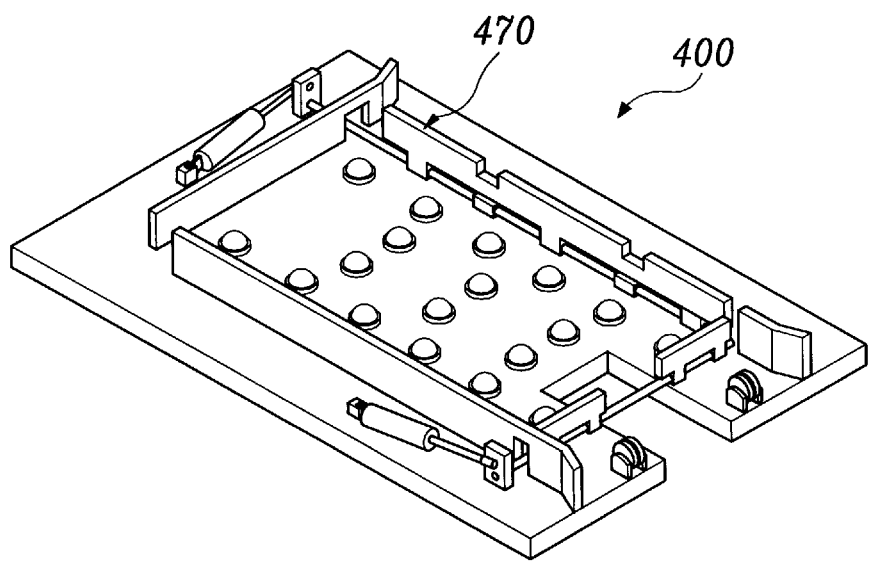
FIG. 21 is an another perspective view of the output part in FIG. 2 taken from another position.
Figure 22:
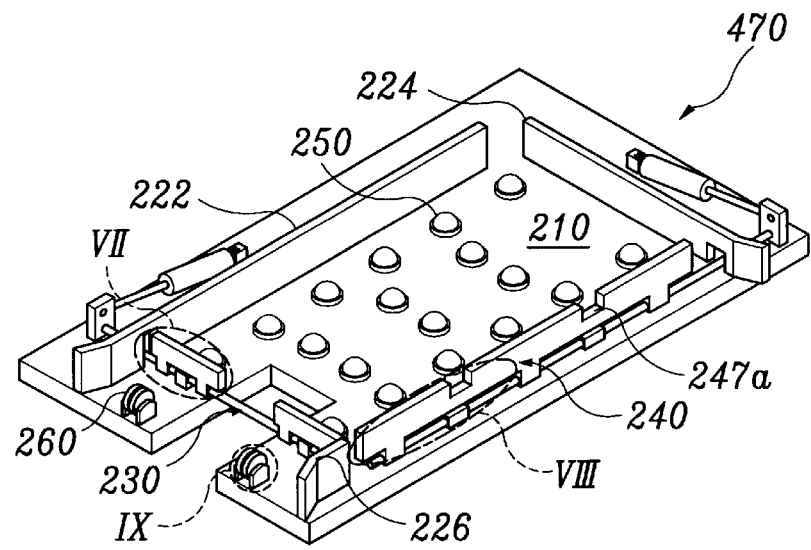
FIG. 22 is a perspective view of the supporting part in FIG, 20.
Figure 23:
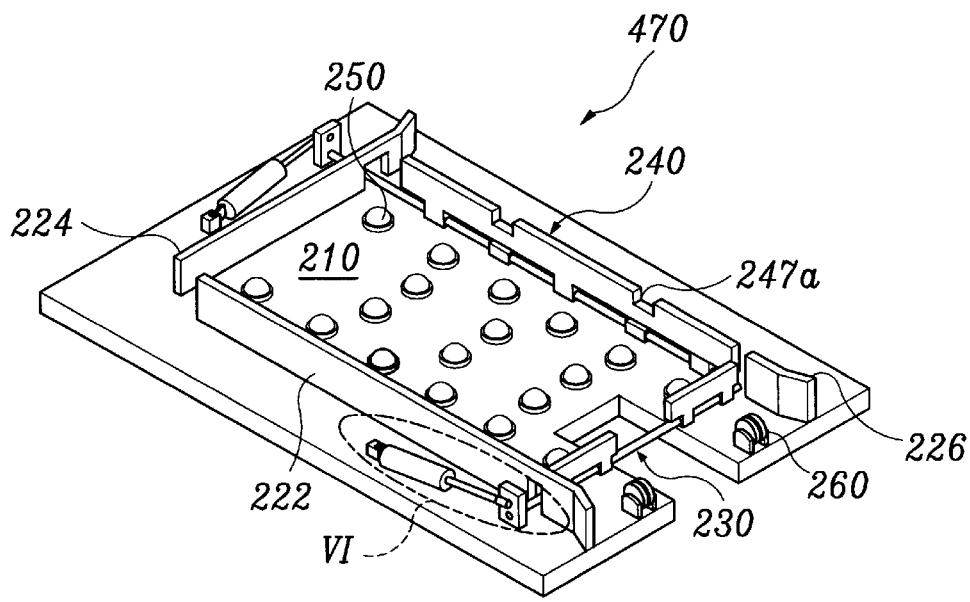
FIG. 23 is an another perspective view of the supporting part in FIG. 20 taken from another position.

PIG. 20 is a perspective view of the output part in FIG. 2; FIG. 21 is an another perspective view of the output part in FIG. 2 taken from other position;

FIG. 22 is a perspective view of the supporting part in FIG, 20; and FIG. 23 is an another perspective view of the supporting part in FIG. 20 taken from other position.

The detailed explanation of the output part (400) and the supporting part (470) with reference to FIG. 20 through 23 will not be given, since the supporting part (410) of the output art (400) has the same structure as that of the supporting part (270) of the input part (200).

Figure 24:
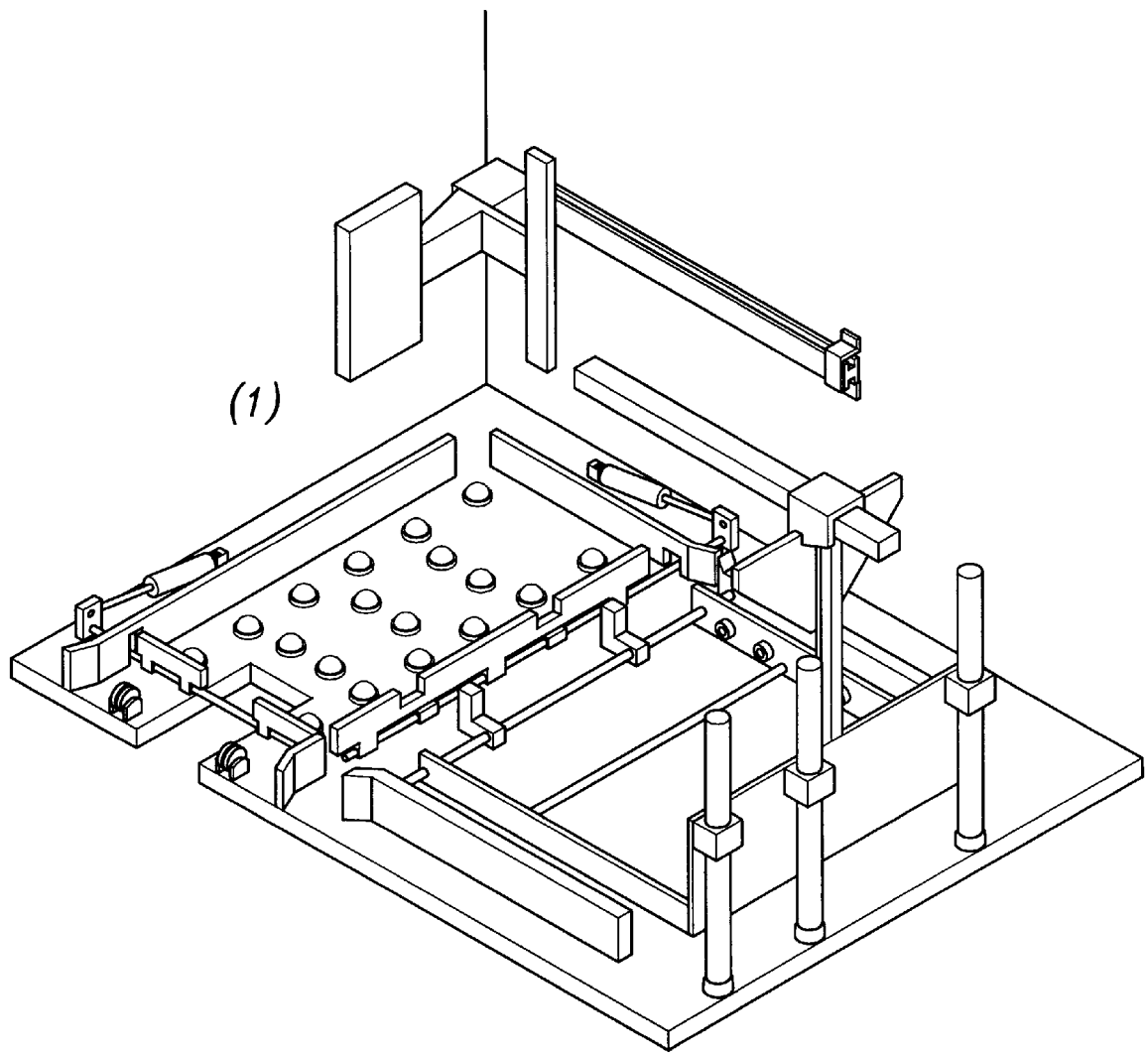
FIG. 24 through FIG. 26 are perspective views depicting the state of supplying a carrier loaded with printed circuit boards to be tested to an input part.
Figure 25:
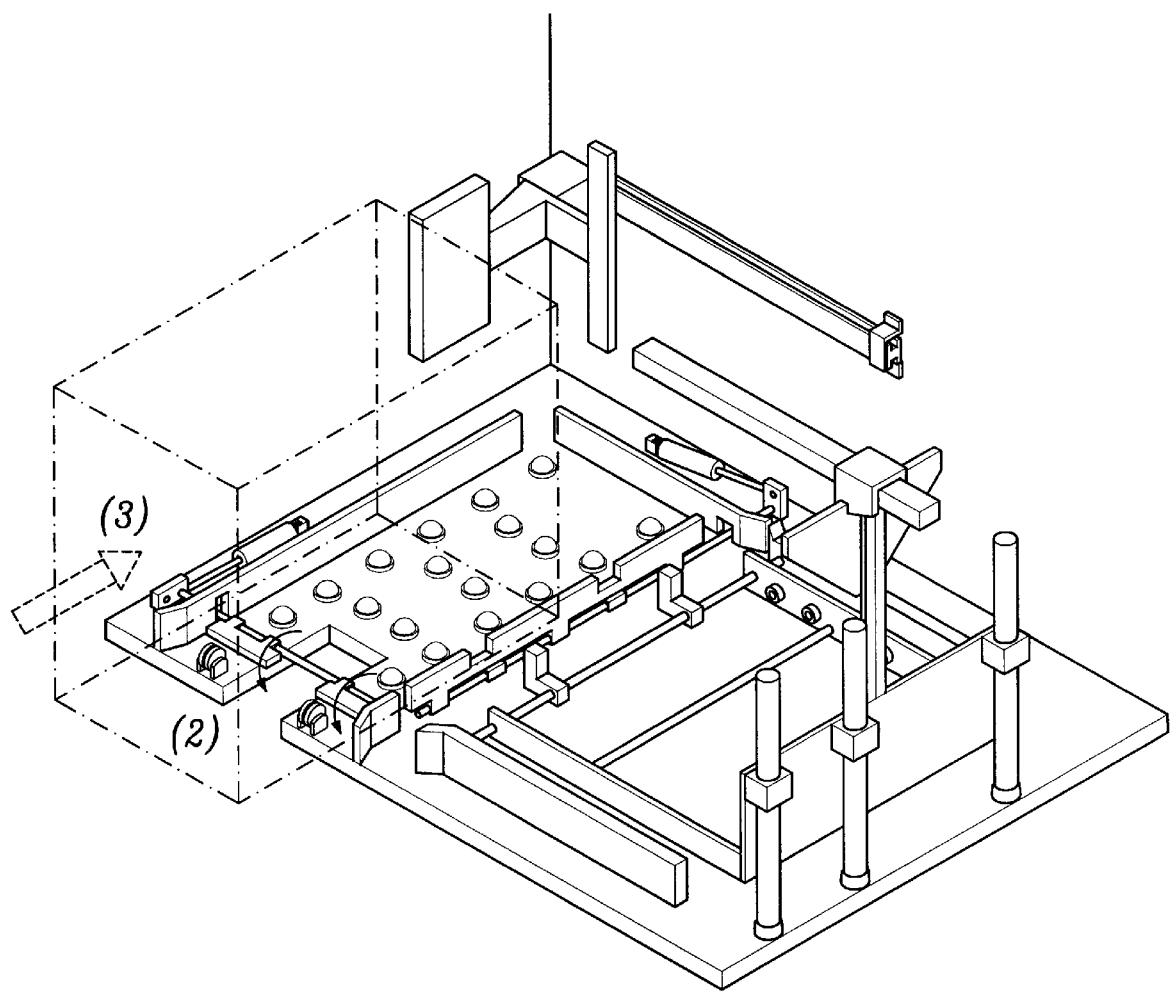
Figure 26:
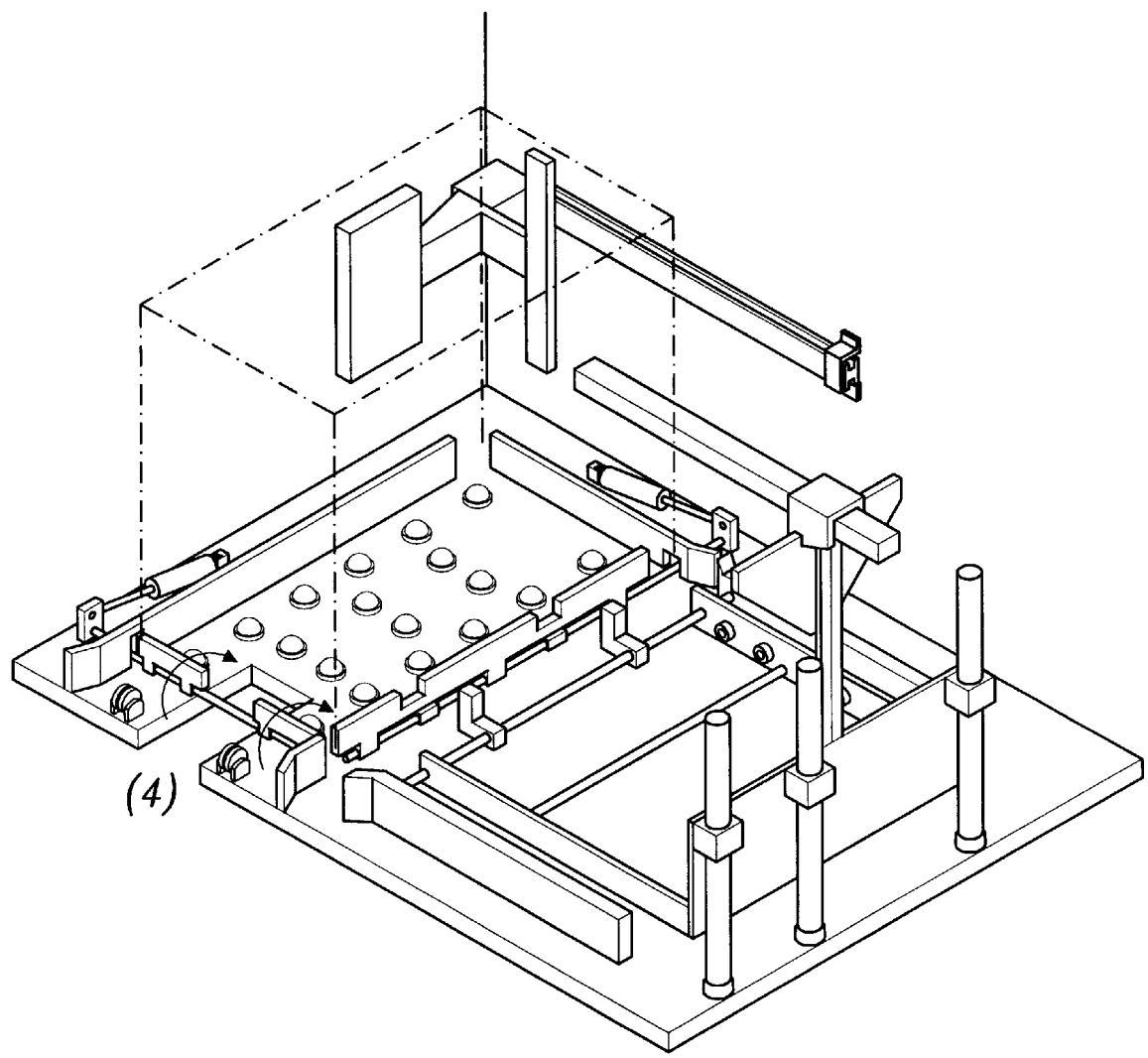
Figure 27:
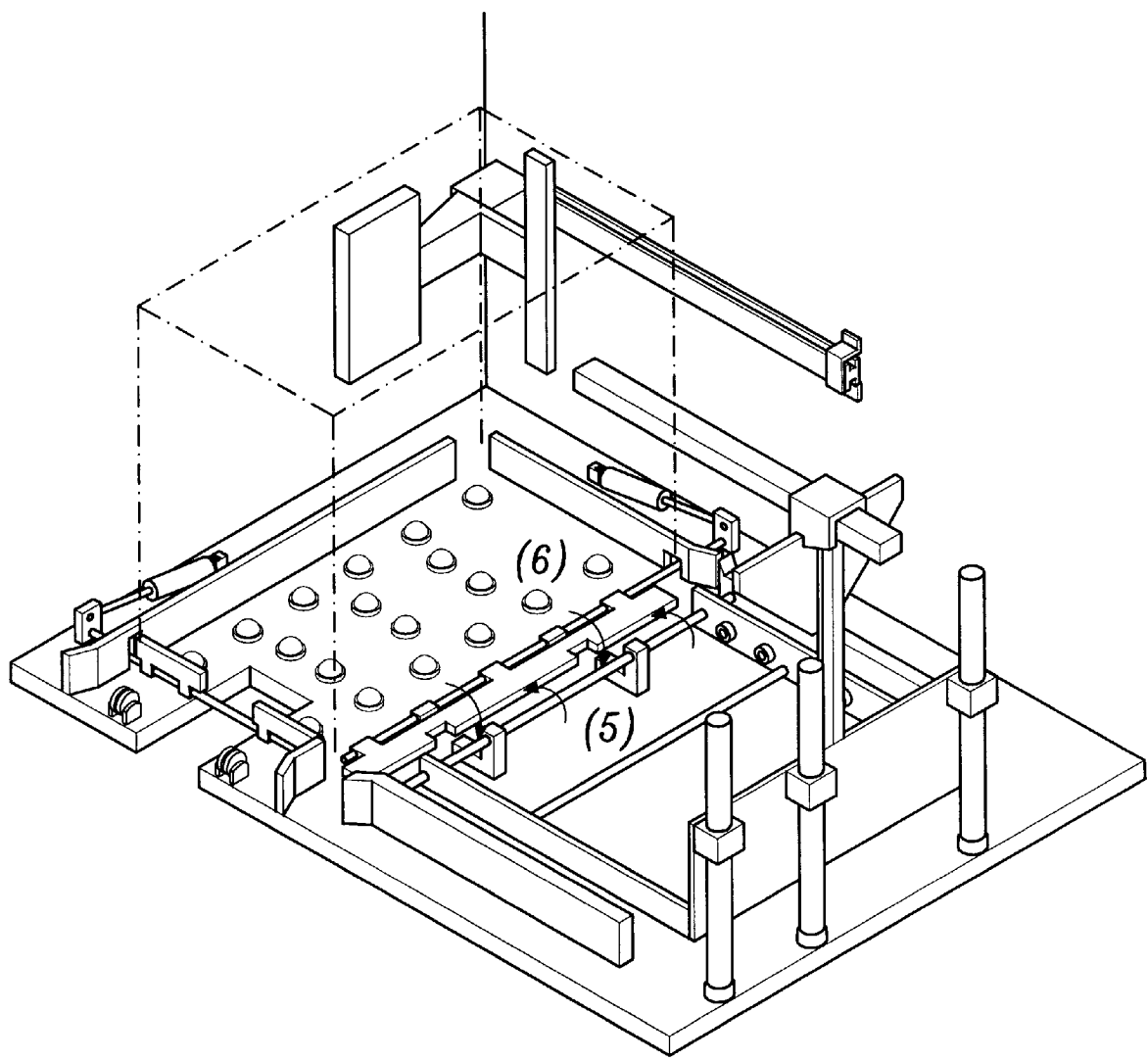
FIG. 27 through FIG. 29 are perspective views depicting the state of transferring the carrier in FIG. 26 to an elevator part.
Figure 28:
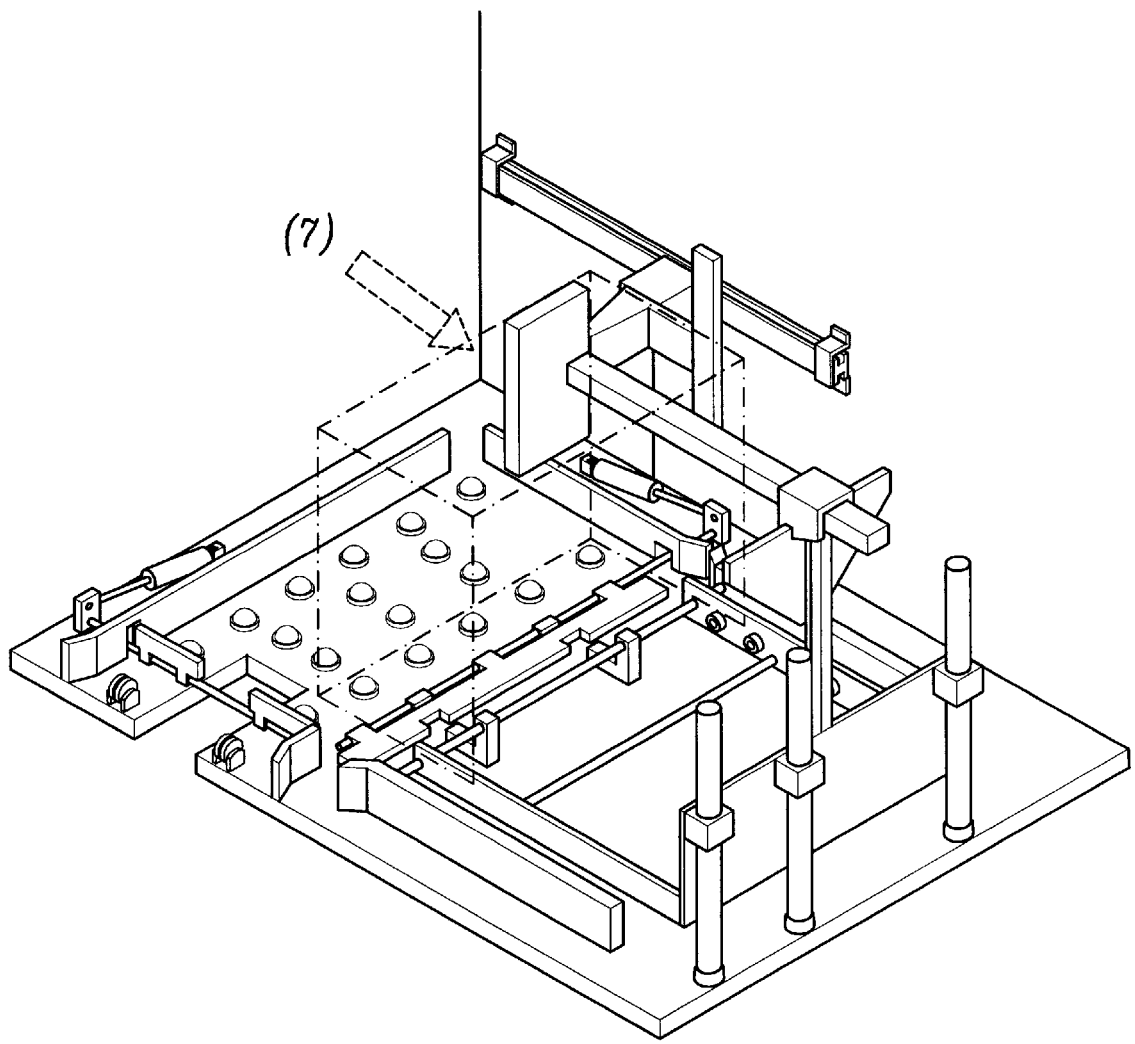
Figure 29:
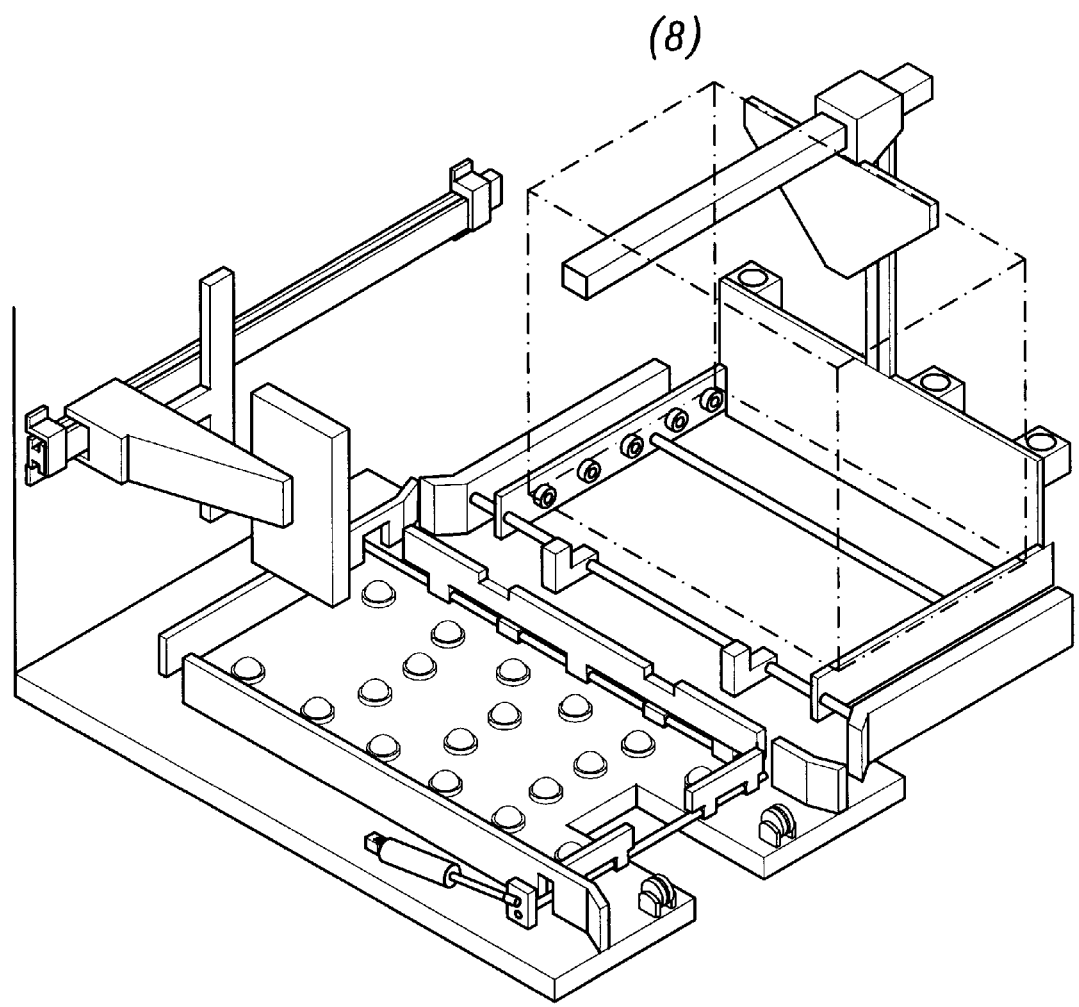
Figure 30:
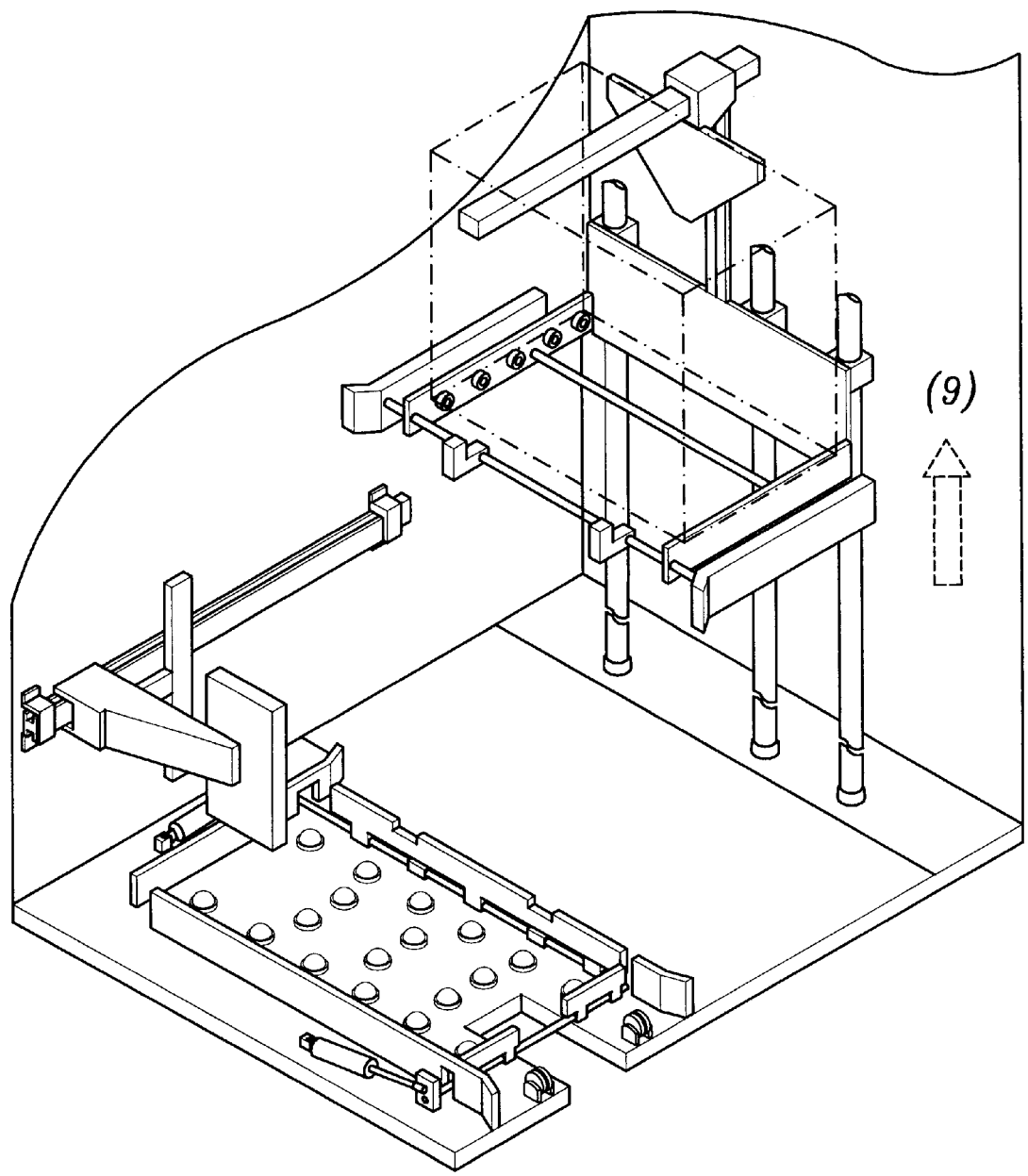
FIG. 30 is a perspective view depicting the state of lifting the carrier from the lowest position to the highest position by an elevator part.
Figure 31:
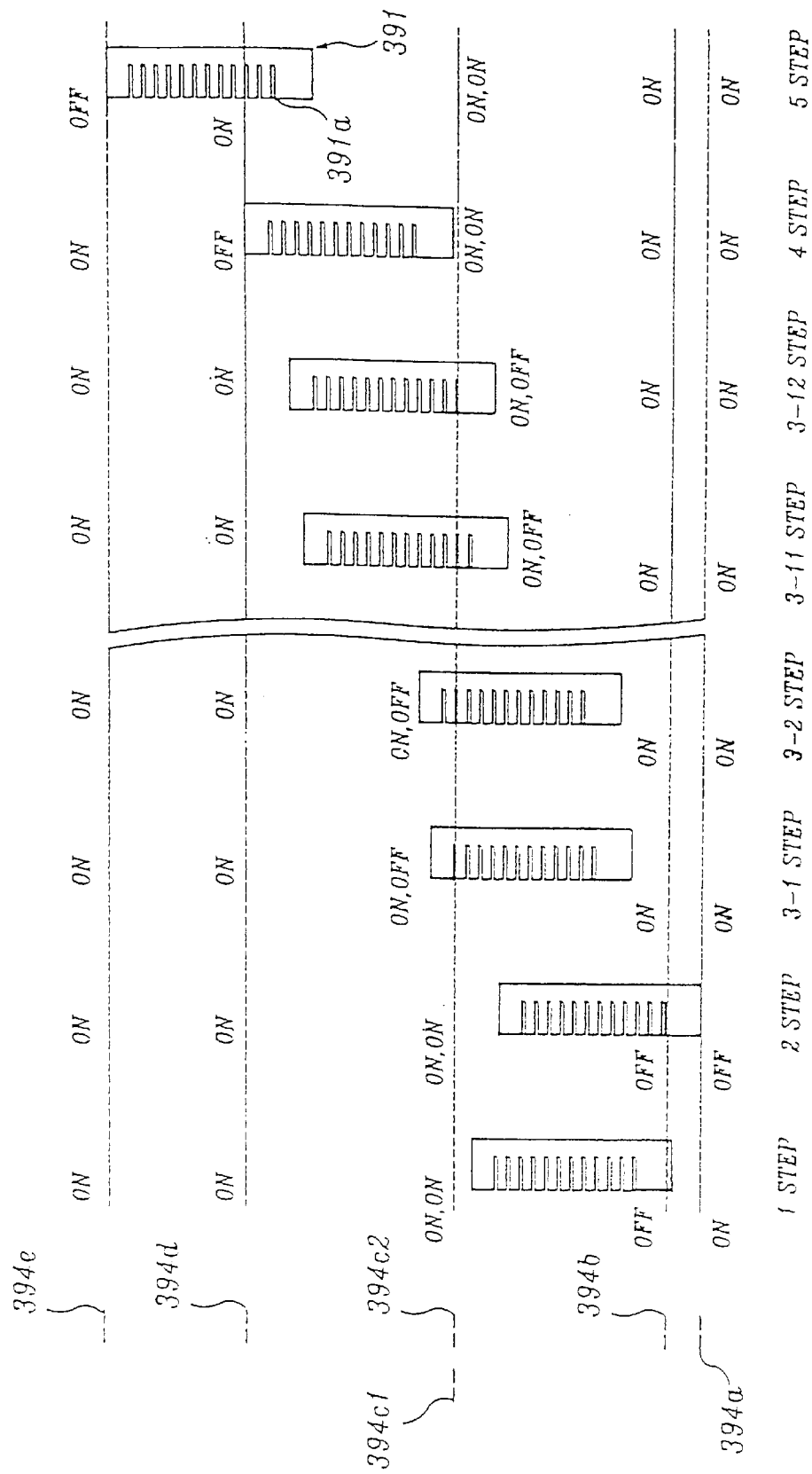
FIG. 31 is a schematic diagram depicting the specific steps in FIG. 30.
Figure 32:
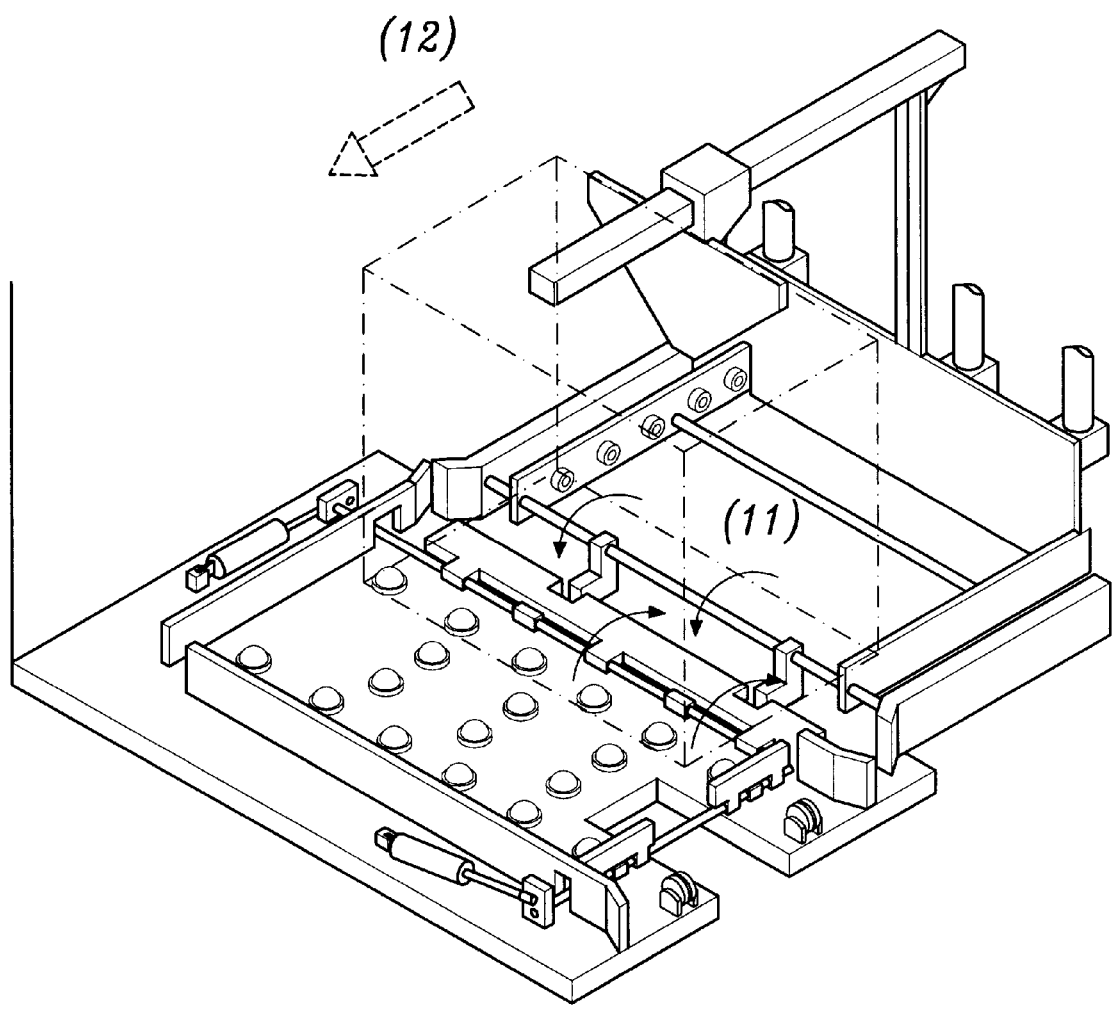
FIG. 32 and FIG. 33 are perspective views depicting the transfer of the carrier to an output part in FIG. 30.
Figure 33:
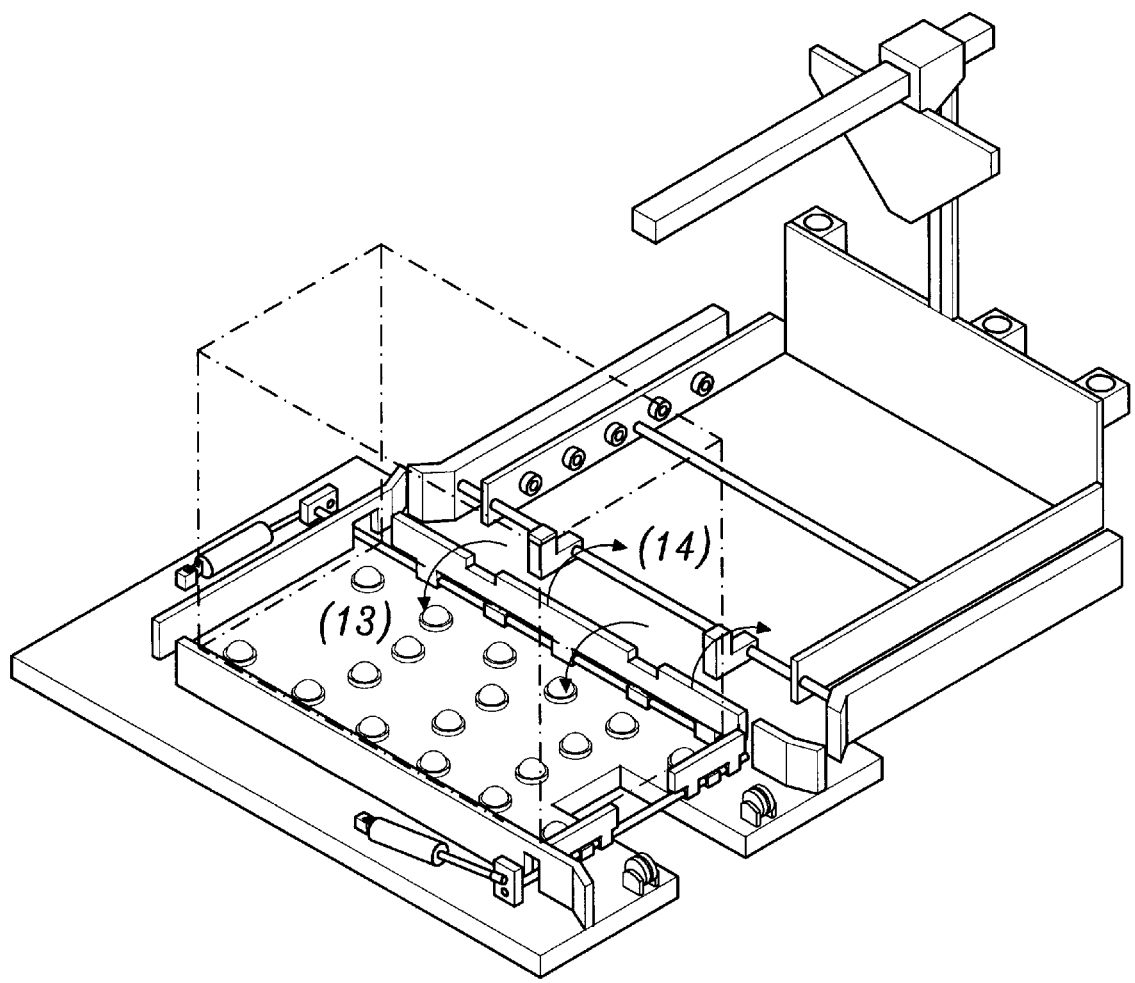
Figure 34:
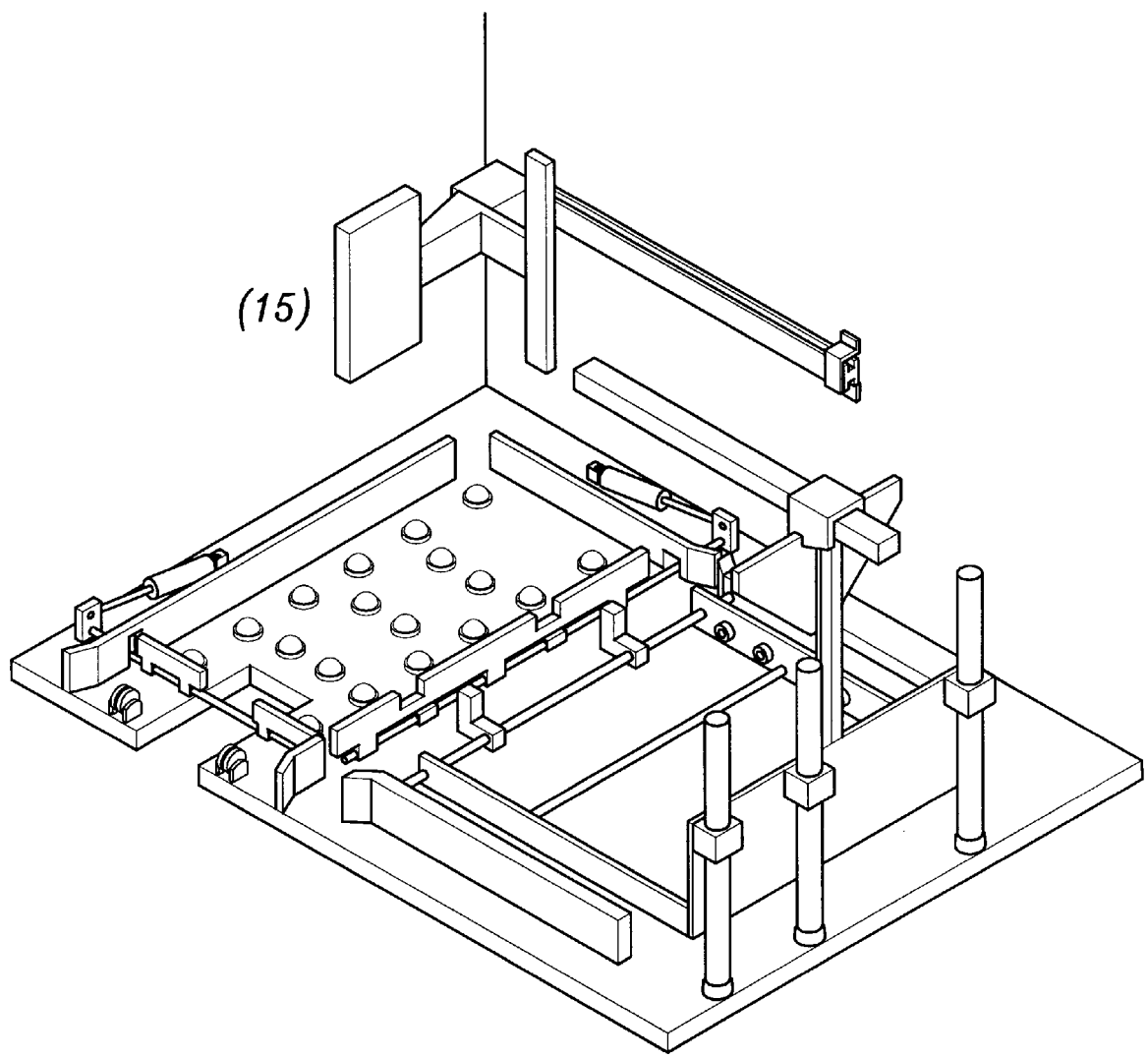
FIG. 34 is a perspective view depicting the lowering of the elevator part to the lowest position.
Figure 35:
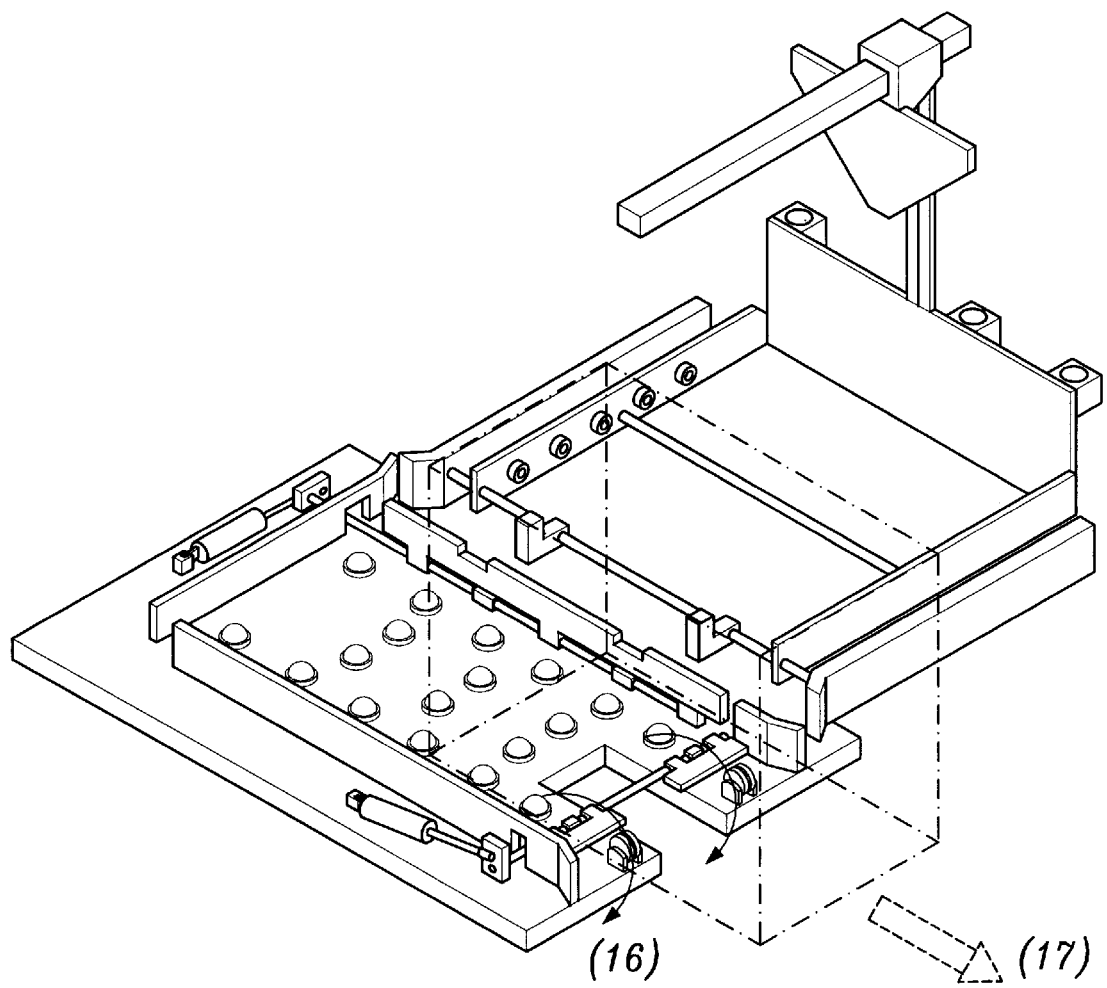
FIG. 35 and FIG. 36 are perspective views depicting the state of removing the carrier from the output part.

FIG. 24 through FIG. 36 depict the whole stages of the transfer of the carrier using the transfer apparatus according to the present invention. FIG. 24 through FIG. 26 are perspective views depicting the state of supplying a carrier loaded with printed circuit boards to be tested to an input part; FIG. 27 through FIG. 29 are perspective views depicting the state of transferring the carrier in FIG. 26 to an elevator part; FIG. 30 is a perspective view depicting the state of lifting the carrier from the lowest position to the highest position in an elevator part; FIG. 31 is a schematic diagram depicting the specific steps in FIG. 30; FIG. 32 and FIG. 33 are perspective views depicting the transfer of the carrier to an output part in FIG. 30; FIG. 34 is a perspective view depicting the lowering of the elevator part to the lowest position; and FIG. 35 and FIG. 36 are perspective views depicting the state of removing the carrier from the output part.

In FIG. 24 through FIG. 36, the numerical numbers within parenthesis indicate the sequence of the operations of the transfer apparatus of the invention. The operations of the transfer apparatus according to the present invention will be described below with reference to FIG. 24 through FIG. 36.

(1) FIG. 24 shows schematically the input and elevator parts at the initial stage.

(2)–(3) The first opening means of the input part is opened by an electrical signal and a carrier is fed into the input part. The feeding of the carrier may be accomplished manually or by an automated carter.

(4) After completion of feeding the carrier, the first opening means is closed by an electrical signal.

(5)–(6) The opening means of the elevator part and the second opening means of the input part are sequentially opened by electrical signals. The groove on the second opening means of the input part is to minimize the gap between the keepers of the opening means of the elevator part.

(7)–(8) The carrier is transferred from the input part to the elevator part by the action of cylinder of the input part.

(9) The carrier loaded on the elevator part is moved from its original position to the highest position. The detailed explanation of this step will be given below with reference to FIG. 31.

FIG. 31 depicts the relationship between the sensor of the elevator part and the plate with scaled gaps of the elevator part, and each step of lifting the carrier. Since the plate with scaled gap is fixed to the supporting and transferring means 370 of the elevator part, the lifting of the plate is accompanied by the lifting of the elevator part. In FIG. 31, the sensor and the plate were shown in one plan.

Step ①: The sensor 394b is on 'OFF' state by the lowest part of the plate, and all of the other sensors are on 'ON' state.

Step ②: The carrier is moved from the input part to the elevator part. The elevator, which is in its original lowest position, will be lifted when the sensor 394a is in 'OFF' state by the lowest part of the plate.

Step ③-1: When the sensor 394c1 is in 'ON' state and the sensor 394c2 is in 'OFF' state by the plate lifted in step ②, the elevator stops and the push-up means 296 moves the first printed circuit board in the highest part of the carrier to the unloader/loader. Then, a semiconductor device package is mounted on the printed circuit board by the unloader/loader, the printed circuit board is returned to the carrier. Thereafter, the elevator moves upward.

Step ③-2: When the sensor 394c1 is in 'ON' state and the sensor 394c2 is in 'OFF' state by the plate lifted in step ③-1, the elevator stops and the push-up means moves the second printed circuit board in the second row of the carrier to the unloader/loader. Then, a semiconductor device package is mounted on the printed circuit board by the unloader/loader, the printed circuit board is returned to the carrier. Thereafter, the elevator moves upward.

The procedure of the steps of ③-3 to ③-10 is repeated.

Step ③-11: When the sensor 394c1 is in 'ON' and the sensor 394c2 is in 'OFF' state by the plate lifted in step ③-10, the elevator stops and the push-up means 396 moves the eleventh printed circuit board in the lowest part of the carrier to the unloader/loader. Then, a semiconductor device package is mounted on the printed circuit board by the unloader/loader, the printed circuit board is returned to the carrier. Thereafter, the elevator moves upward.

Step ③-12: When the sensor 394c1 is in 'ON' state and the sensor 394c2 is in 'OFF' state by the plate lifted in step ③-11, the elevator stops and the pushup means moves the twelfth printed circuit board in the lowest part of the carrier to the unloader/loader. Then, a semiconductor device package is mounted on the printed circuit board by the unloader/loader, the printed circuit board is returned to the carrier. Thereafter, the elevator moves upward.

Step ④: When the sensor 394d is in 'OFF' state by the plate lifted in step ③-12, the elevator still moves upward regardless of the state of the sensors 394c 1 and 394c2.

Step ⑤: When the sensor 394e is in 'OFF' state by the plate lifted in step ④, the elevator still stops and is ready for transferring the carrier from the elevator part to the output part, which is carried out regardless of the state of the sensors 394d.

(10)–(12) The second opening means of the output part and the opening means of the elevator part are sequentially opened by electrical signals. And, the carrier is transferred from the elevator part to the output part by the action of the transfer member of the elevator part.

(13)–(14) After completion of transferring the carrier from the elevator part to the output part, the second opening means of the output part and the opening means of the elevator part are sequentially closed.

(15) The elevator moves down to its original position, which corresponds to the position in step ① in FIG. 31.

(16)–(17) The first opening means of the output part is opened, and the carrier is removed therefrom by manually or by an automated carter.

Figure 36:
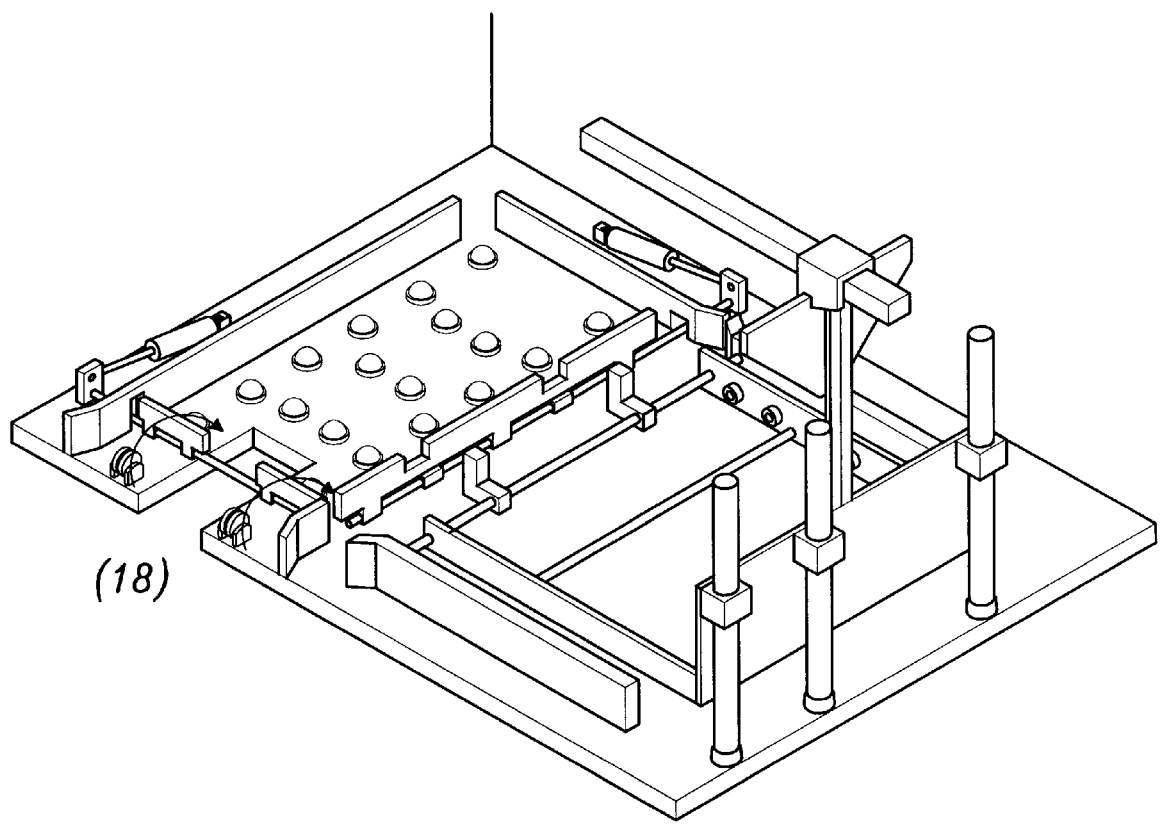

(18) FIG. 36 shows the state that the carrier has been removed from the output part.

Although the transfer apparatus has been described in relation with a loading of semiconductor device packages to printed circuit board, the unloading of the packages from the printed circuit board can be carried out in a same way since the loading and unloading of the package is performed by the unloader/loader.

Moreover, there may be a number of modifications to the sequence of opening and closing of the opening means. However, the procedure described above is advantageous since it can improve the transfer reliability. For example, in steps (5) and (6), after the opening means of the elevator part is completely opened and then the second opening means of the input part is opened, the carrier is moved by the transfer member of the input part, thereby assuring a smooth transfer of the carrier. Alternatively, if the second opening means of the input part and the opening means of the elevator part are sequentially opened, the carrier is moved by the transfer member of the input part after detecting the opening of the opening means of the elevator part, only one safety means is provided for transferring the carrier. There is a significant difference of failure frequencies between the two processes.

The carrier transfer apparatus for unloading and/or loading semiconductor device packages from and/or to printed circuit boards loaded into a carrier reduces time and improves productivity.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A carrier transfer apparatus, comprising:
(a) a housing portion with a bottom interior surface, a back interior surface, a top interior surface, and side interior surfaces;
(b) an input portion disposed within said housing portion, comprising:
  (i) an input plate fixed on said bottom interior surface, said input plate including a side edge and a front edge;
  (ii) a plurality of input guide means mounted on said input plate to guide a carrier therethrough;
  (iii) a first input opening means mounted on said front edge of said input plate to receive or discharge a carrier;

(iv) a second input opening means mounted on said side edge of said input plate to receive a carrier from or to discharge a carrier to an elevator portion;

(v) a plurality of input rolling members, mounted on said input plate such that said first input opening means is disposed between said input rolling members and one of said input guide means; and (vi) an input transfer means fixed to said back interior surface of said housing portion disposed above said input plate and operable by an electrical signal;

(c) an elevator portion for receiving a carrier from said input transfer means, disposed within said housing portion adjacent to said input portion, comprising:

(i) a rotatable shaft, and a motor driven by an electrical signal, said rotatable shaft being fixed to said bottom interior surface and said top interior surface of said housing portion and driven by said motor;

(ii) an elevator transfer means, comprising:
a first and a second transfer guide rod fixed to said bottom interior surface and said top interior surface of said housing portion wherein said rotatable shaft is disposed between said first transfer guide rod and said second transfer guide rod;
a transfer body fixed to said first and to said second transfer guide rods and operatively connected to said rotatable shaft,
a pair of opposing transfer guide members each having a first and a second end, said second end fixed to said transfer body;
a plurality of reinforcing members fixed between said pair of opposing transfer guide members parallel to said transfer body;
a plurality of transfer rolling members mounted on said opposing transfer guide members, and
a sub-transfer means fixed to said transfer body;

(iii) an elevator opening means fixed between said opposing pair of transfer guide members at said first end of said transfer guide members, said elevator opening means being operated by an electrical signal;

(iv) first and second guide rods and a sensor part plate having scaled horizontal gaps, disposed adjacent said first and second transfer guide rods with said sensor plate being in a movable relationship with said first and second guide rods, said sensor part plate being vertically displaced by an electrical signal, said first and second guide rods being fixed to said bottom interior surface and said top interior surface of said housing portion;

(v) a plurality of sensors fixed to said first and to said second guide rods, said sensors driving said motor by an on/off state of the electrical signal by each gap of the sensor part plate; and (vi) a vertical displacement push-up member mounted on said housing portion and being operated by an electrical signal from said sensors; and (d) an output portion disposed within said housing portion above said input portion, comprising:

(i) an output plate fixed to one of said side interior surfaces and the back interior surface of said housing portion and being disposed above said input transfer means, said output plate having a front edge and a side edge;

(ii) a plurality of output guide means mounted on said output plate;

(iii) a first output opening means provided on the front edge of said output plate to discharge a carrier;

(iv) a second output opening means provided on the side edge of said output plate to receive a carrier from said elevator portion;

(v) a plurality of output rolling members, mounted on said front edge of said output plate such that said first output opening means is disposed between said output rolling members and said output guide means; and (vi) an output transfer means fixed to said back interior surface of said body portion disposed above said output plate and being operated by an electrical signal.

2. The apparatus according to claim 1, further including a plurality of ball bearings provided at an area surrounded by said input guide means and said first and second input opening means, said ball bearings and said input rolling members having the same height.

3. The apparatus according to claim 2, wherein at least one of said first and second input opening means comprises
a cylinder operated by an air pressure;
a rod provided with a plurality of keepers movable between vertical and horizontal positions and being associated with the cylinder; and
a supporting member for supporting the rod.

4. The apparatus according to claim 3, wherein said keepers have a height greater than a height of said input rolling members and said ball bearings when a chosen one of said first or second input opening means is in a vertical position, and said keepers have a height smaller than said height of said input rolling members and said ball bearings when said chosen input opening means is in a horizontal position.

5. The apparatus according to claim 3, wherein said keepers have a height greater than a height of said output rolling members and said ball bearings when a chosen one of said first or second output opening means is in a vertical position, and said keepers have a height smaller than said height of said output rolling members and said ball bearings when said chosen output opening means is in a horizontal position.

6. The apparatus according to claim 2, wherein the input rolling members are movable in one direction.

7. The apparatus according to claim 1, said sensors comprise one or more infrared ray detectors, said infrared detector having at least two fingers one of which emits infrared radiation and another receives infrared radiation.

8. A carrier transfer apparatus, comprising:

(a) a housing portion with a bottom interior surface;

(b) an input portion fixed to said bottom interior surface of said housing portion for loading, receiving, or discharging a carrier therefrom, comprising:

(i) an input plate fixed to said bottom interior surface of said housing portion, said input plate including a front edge and a side edge;

(ii) a first input opening means provided on said front edge of said input plate to receive said carrier;

(iii) a second input opening means provided on said side edge of said input plate for discharging said carrier to an elevator portion; and (iv) input transfer means;

(c) an elevator portion for receiving said carrier from said input transfer means and for vertically displacing said carrier, the elevator portion provided adjacent to said input portion and disposed within said housing portion, the elevator portion comprising:

(i) elevator support means for supporting said carrier;
(ii) elevator opening means mounted on said elevator support means for receiving said carrier from said input transfer means of said input portion;
(iii) elevator transfer means mounted on said elevator support means for transferring said carrier from said elevator portion to an output portion, and a motor mounted in said elevator portion;
(iv) a plurality of sensors for driving said motor by an electrical signal; and
(iv) vertical displacement means operatively connected to said motor for vertically displacing said elevator support means supporting said carrier; and (d) an output portion for receiving and discharging said carrier disposed above said input portion, comprising
(i) an output plate disposed above said input transfer means, said output plate including a side edge and a front edge;
(ii) a first output opening means mounted on said side edge of said output plate for receiving said carrier from said elevator support means;
(iii) a second output opening means mounted on said front edge of said output plate for discharging said carrier from said output portion; and
(iv) output transfer means for transferring said carrier from said output portion and housing portion.

9. The apparatus according to claim 8, wherein at least one of the first and second input opening means comprises:

a cylinder operated by an air pressure;

a rod provided with a plurality of keepers operatively connected to the cylinder; and a supporting member for supporting the rod.

10. The apparatus according to claim 8, said sensors comprise one or more infrared ray detectors, said infrared detector having at least two fingers one of which emits infrared radiation and another receives infrared radiation.

* * * * *